US012660447B2

(12) United States Patent (10) Patent No.: US 12,660,447 B2
Lim et al. (45) Date of Patent: Jun. 16, 2026

(54) DISPLAY DEVICE INCLUDING A SCAN DRIVING CIRCUIT HAVING A PLURALITY OF STAGES CONNECTED THROUGH CARRY WIRINGS

(71) Applicant: Samsung Display Co., LTD., Yongin-si (KR)

(72) Inventors: Dogi Lim, Yongin-si (KR); Kyunghoon Park, Yongin-si (KR); Young Je Cho, Yongin-si (KR); Chanhoe Koo, Yongin-si (KR); Seongyoung Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 35 days.

(21) Appl. No.: 18/379,242

(22) Filed: Oct. 12, 2023

(65) Prior Publication Data

US 2024/0260349 A1 Aug. 1, 2024

(30) Foreign Application Priority Data

Jan. 26, 2023 (KR) ........................ 10-2023-0010418

(51) Int. Cl.
H10K 59/131 (2023.01)
G09G 3/3233 (2016.01)
(Continued)

(52) U.S. Cl.
CPC ......... H10K 59/131 (2023.02); G09G 3/3233 (2013.01); G09G 3/3266 (2013.01); H10K 59/124 (2023.02); G09G 2300/0819 (2013.01); G09G 2300/0842 (2013.01); G09G 2310/08 (2013.01)

(58) Field of Classification Search
CPC .. H10K 59/131; H10K 59/124; G09G 3/3233; G09G 3/3266; G09G 2300/0819; G09G 2300/0842; G09G 2310/08
See application file for complete search history.

(56) References Cited

U.S. PATENT DOCUMENTS

| 9,397,150 B2 | 7/2016 | Kim et al. | |
| 2006/0267492 A1* | 11/2006 | Oh ..................... | H10K 50/8426 |
| | | | 313/506 |

(Continued)

FOREIGN PATENT DOCUMENTS

| KR | 20170125171 A | * 11/2017 |
| KR | 102195166 B1 | 12/2020 |
| KR | 102376590 B1 | 3/2022 |

*Primary Examiner* — Kirk W Hermann
(74) *Attorney, Agent, or Firm* — CANTOR COLBURN LLP

(57) ABSTRACT

A display device includes a base layer, a pixel disposed on the base layer, and a scan driving circuit disposed on the base layer and connected to the pixel. The scan driving circuit includes a plurality of stages, a $j^{th}$ stage among the plurality of stages is connected to at least one adjacent stage through carry wirings. The $j^{th}$ stage includes a plurality of control transistors connected to a first control node, and a control wiring connecting the first control node and the plurality of control transistors. Two or more insulation layers are arranged between the control wiring and the carry wirings.

26 Claims, 17 Drawing Sheets

(51) Int. Cl.
  *G09G 3/3266*    (2016.01)
  *H10K 59/124*    (2023.01)

(56)         References Cited

U.S. PATENT DOCUMENTS

| 2015/0187862 | A1* | 7/2015 | Kim ........................ | H10D 86/60 |
| | | | | 438/23 |
| 2016/0180787 | A1* | 6/2016 | Park ..................... | G11C 19/287 |
| | | | | 345/212 |
| 2016/0358573 | A1* | 12/2016 | Takeuchi ............... | G11C 19/28 |
| 2017/0032733 | A1* | 2/2017 | Jang ......................... | G09G 3/20 |
| 2020/0243032 | A1* | 7/2020 | Gu ........................... | G11C 7/02 |
| 2020/0371642 | A1* | 11/2020 | Yamai ................. | G02F 1/13338 |
| 2021/0074196 | A1* | 3/2021 | Feng ....................... | G09G 3/20 |
| 2021/0142713 | A1* | 5/2021 | Feng ..................... | G11C 19/28 |
| 2021/0183312 | A1* | 6/2021 | Kim ..................... | G09G 3/3266 |
| 2022/0199032 | A1* | 6/2022 | Hong ..................... | G11C 19/28 |
| 2022/0319425 | A1* | 10/2022 | Yu ........................ | G09G 3/3241 |

* cited by examiner

FIG. 5

DISPLAY DEVICE INCLUDING A SCAN DRIVING CIRCUIT HAVING A PLURALITY OF STAGES CONNECTED THROUGH CARRY WIRINGS

This application claims priority to Korean Patent Application No. 10-2023-0010418, filed on Jan. 26, 2023, and all the benefits accruing therefrom under 35 U.S.C. § 119, the content of which in its entirety is herein incorporated by reference.

BACKGROUND

1. Field

Embodiments of the disclosure described herein relate to a display device, and more particularly, to a display device having improved reliability.

2. Description of the Related Art

A plurality of pixels is arranged in an active area of a display panel. A gate driving circuit for driving the plurality of pixels is disposed in a non-active area of the display panel. The gate driving circuit may include a light-emitting driving circuit and a scan driving circuit. The gate driving circuit may be formed through a process of manufacturing a driving circuit for pixels.

SUMMARY

Embodiments of the disclosure provide a display device including a scan driving circuit having improved reliability.

In an embodiment of the disclosure, a display device includes a base layer, a pixel disposed on the base layer, and a scan driving circuit disposed on the base layer and connected to the pixel.

In an embodiment, the scan driving circuit may include a plurality of stages, and a $j^{th}$ stage among the plurality of stages may be connected to at least one adjacent stage through carry wirings. Herein, j is a natural number greater than or equal to one.

In an embodiment, the $j^{th}$ stage may include a plurality of control transistors connected to a control node and a control wiring line that connects the control node and the plurality of control transistors. Two or more insulation layers may be arranged between the control wiring and the carry wirings.

In an embodiment of the disclosure, a display device includes a base layer, a plurality of pixels arranged on the base layer, and a scan driving circuit disposed on the base layer and connected to the plurality of pixels.

In an embodiment, the scan driving circuit may include a plurality of stages, and a $j^{th}$ stage among the plurality of stages may be connected to at least one adjacent stage through carry wirings.

In an embodiment, the $j^{th}$ stage may include a plurality of driving transistors connected to a control node and a control wiring that connects the control node and the plurality of driving transistors.

In an embodiment, the control wiring may include a first wiring portion intersecting the carry wirings such that the first wiring portion and the carry wirings are insulated from each other and a second wiring portion that does not intersect the carry wirings, and the first wiring portion and the second wiring portion may be arranged on different layers.

BRIEF DESCRIPTION OF THE DRAWINGS

The above and other embodiments, advantages and features of the disclosure will become apparent by describing in detail embodiments thereof with reference to the accompanying drawings.

FIG. 5 is a block diagram illustrating an embodiment of a scan driving circuit and the pixel according to the disclosure.

DETAILED DESCRIPTION

Figure 1:
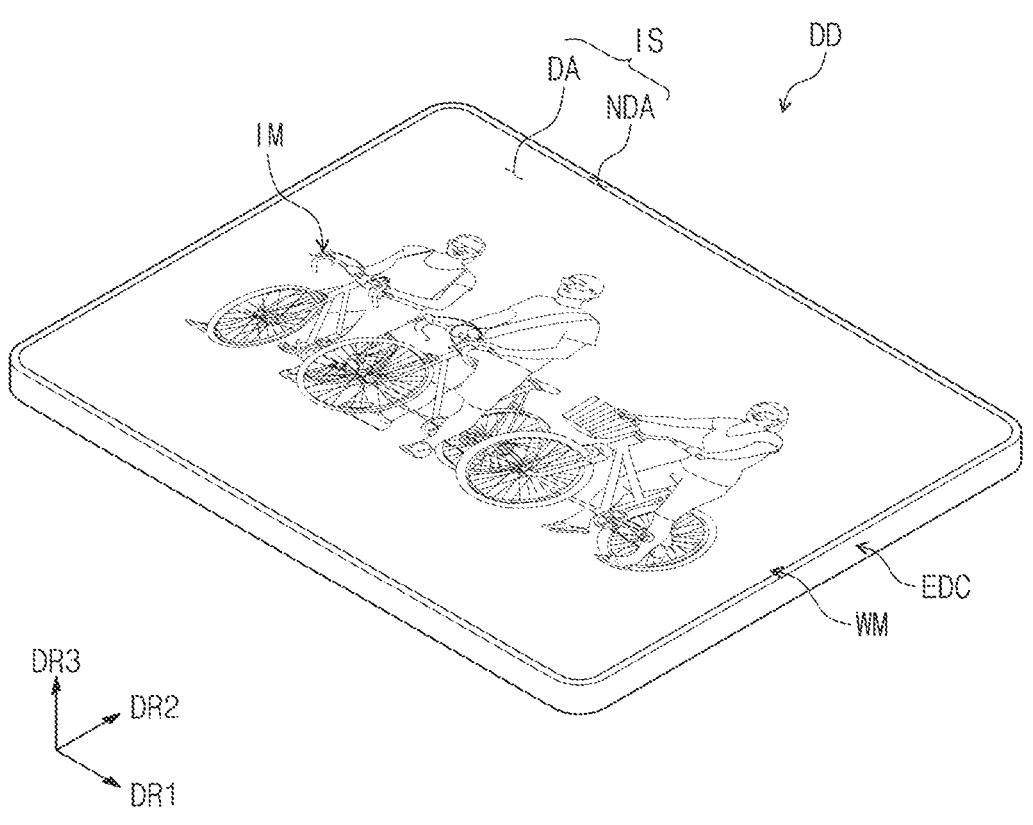
FIG. 1 is a perspective view of an embodiment of a display device according to the disclosure.

In the specification, the expression that a first component (or area, layer, part, portion, etc.) is "disposed on", "connected with" or "coupled to" a second component means that the first component is directly disposed on/connected with/coupled to the second component or means that a third component is interposed therebetween.

The same reference numerals refer to the same components. Further, in the drawings, the thickness, the ratio, and the dimension of components are exaggerated for effective description of technical contents. The expression "and/or" includes one or more combinations which associated components are capable of defining.

Although the terms "first", "second", etc. may be used to describe various components, the components should not be limited by the terms. The terms are only used to distinguish one component from another component. For example, without departing from the right scope of the present disclosure, a first component may be referred to as a second component, and similarly, the second component may be also referred to as the first component. Singular expressions include plural expressions unless clearly otherwise indicated in the context.

Also, the terms "under", "below", "on", "above", etc. are used to describe the correlation of components illustrated in drawings. The terms that are relative in concept are described based on a direction illustrated in drawings.

It will be understood that the terms "include", "comprise", "have", etc. specify the presence of features, numbers, steps, operations, elements, or components, described in the specification, or a combination thereof, and do not exclude in advance the presence or additional possibility of one or more other features, numbers, steps, operations, elements, or components or a combination thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical terms and scientific terms) used in the specification have the same meaning as commonly understood by those skilled in the art to which the disclosure belongs. Furthermore, terms such as terms defined in the dictionaries commonly used should be interpreted as having a meaning consistent with the meaning in the context of the related technology, and should not be interpreted in overly ideal or overly formal meanings unless explicitly defined herein.

Hereinafter, embodiments of the disclosure will be described with reference to accompanying drawings.

Figure 2:
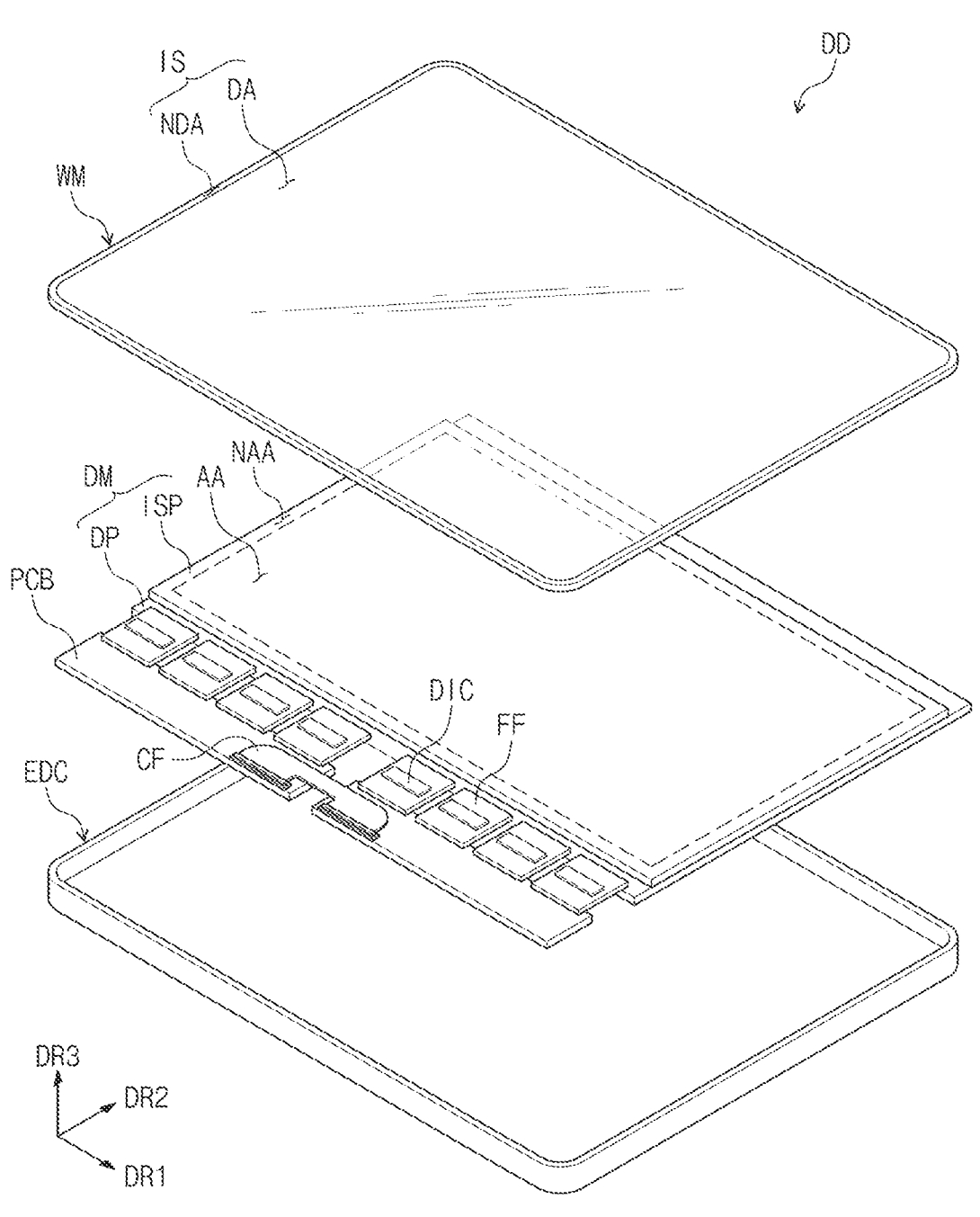
FIG. 2 is an exploded perspective view of an embodiment of the display device according to the disclosure.

FIG. 1 is a perspective view of an embodiment of a display device according to the disclosure, and FIG. 2 is an exploded perspective view of an embodiment of the display device according to the disclosure.

Referring to FIGS. 1 and 2, a display device DD may be a device that is activated according to an electric signal. The display device DD according to the disclosure may be large-sized display devices such as a television and a monitor as well as small or medium-sized display devices such as mobile phones, tablet computers, laptop computers, car navigation systems, and game consoles. These are merely illustrative embodiments, and it is apparent that the display device DD may be implemented in other forms without departing from the concept of the disclosure. The display device DD has a quadrangular shape, e.g., rectangular shape having long sides in a first direction DR1 and short sides in a second direction DR2 intersecting the first direction DR1. However, the shape of the display device DD is not limited thereto, and the display devices DD having various shapes may be provided. The display device DD may display an image IM in a third direction DR3 on a display surface IS parallel to the first direction DR1 and the second direction DR2. The display surface IS on which the image IM is displayed may correspond to a front surface of the display device DD.

In an embodiment, a front surface (or an upper surface) and a rear surface (or a lower surface) of each member are defined with respect to a direction in which the image IM is displayed. The front surface and the rear surface may be opposite to each other in the third direction DR3, and a normal direction of each of the front and rear surfaces may be parallel to the third direction DR3.

A separation distance between the front surface and the rear surface in the third direction DR3 may correspond to a thickness of the display device DD in the third direction DR3. Directions indicated by the first to third directions DR1, DR2, and DR3 are relative concepts and may be changed to other directions.

The display device DD may detect an external input applied from the outside. The external input may include various types of inputs provided from the outside of the display device DD. The display device DD in an embodiment of the disclosure may detect an external input of a user, which is applied from the outside. The external input of the user may be any one or combinations of various types of external inputs such as a portion of a body of the user, light, heat, gaze, or pressure. Further, the display device DD may detect the external input of the user applied to a side surface or rear surface of the display device DD according to a structure of the display device DD, and the disclosure is not limited thereto. In an embodiment of the disclosure, the external input may include an input by an input device (e.g., a stylus pen, an active pen, a touch pen, an electronic pen, an e-pen, or the like).

The display surface IS of the display device DD may be divided into a display area DA and a non-display area NDA. The display area DA may be an area on which the image IM is displayed. The user visually recognizes the image IM through the display area DA. In an embodiment, the display area DA has a quadrangular shape having rounded vertexes. However, this is illustratively illustrated, the display area DA may have various shapes, and the disclosure is not limited to an embodiment.

The non-display area NDA is adjacent to the display area DA. The non-display area NDA may have a predetermined color. The non-display area NDA may surround the display area DA. Accordingly, a shape of the display area DA may be substantially defined by the non-display area NDA. However, this is illustratively illustrated, and the non-display area NDA may be disposed adjacent to only one side of the display area DA or may be omitted. The display device DD in an embodiment of the disclosure may include various embodiments and is not limited to an embodiment.

As illustrated in FIG. 2, the display device DD may include a display module DM and a window WM disposed on the display module DM. The display module DM may include a display panel DP and an input detection layer ISP.

The display panel DP in an embodiment of the disclosure may be a light-emitting display panel. In an embodiment, the display panel DP may be an organic light-emitting display panel, an inorganic light-emitting display panel, or a quantum dot light-emitting display panel. A light-emitting layer of the organic light-emitting display panel may include an organic light-emitting material. A light-emitting layer of the inorganic light-emitting display panel may include an inorganic light-emitting material. A light emission layer of the quantum dot light-emitting display panel may include a quantum dot, a quantum rod, or the like.

The display panel DP may output the image IM, and the output image IM may be displayed through the display surface IS.

The input detection layer ISP may be disposed on the display panel DP to detect the external input. The input detection layer ISP may be directly disposed on the display panel DP. In an embodiment of the disclosure, the input detection layer ISP may be formed on the display panel DP by a subsequent process. That is, when the input detection layer ISP is directly disposed on the display panel DP, an inner adhesive film (not illustrated) is not disposed between the input detection layer ISP and the display panel DP. However, the inner adhesive film may be disposed between the input detection layer ISP and the display panel DP. In this case, the input detection layer ISP is not manufactured by a subsequent process together with the display panel DP, may be manufactured through a separate process from the display panel DP, and may be then fixed to an upper surface of the display panel DP by the inner adhesive film.

The window WM may include or consist of a transparent material through which the image IM may be output. In an embodiment, the window WM may include or consist of glass, sapphire, plastic, or the like, for example. The window WM is illustrated as a single layer, but the disclosure is not limited thereto, and the window WM may include a plurality of layers.

Although not illustrated, the non-display area NDA of the display device DD may be substantially provided as an area in which a material including a predetermined color is printed on one area of the window WM. In an embodiment of the disclosure, the window WM includes a light shielding pattern for defining the non-display area NDA. The light shielding pattern may be formed as a colored organic film, and for example, by a coating method.

The window WM may be coupled to the display module DM through the adhesive film. In an embodiment of the disclosure, the adhesive film may include an optically clear adhesive ("OCA") film. However, the adhesive film is not limited thereto and may include a general adhesive or bonding agent. In an embodiment, the adhesive film may include an optically clear resin ("OCR") or a pressure-sensitive adhesive ("PSA") film, for example.

A reflection prevention layer may be further disposed between the window WM and the display module DM. The reflection prevention layer reduces reflectance of an external light beam input from an upper side of the window WM. The reflection prevention layer in an embodiment of the disclosure may include a phase retarder and a polarizer. The phase retarder may be of a film type or a liquid crystal coating type and may include a $\lambda/2$ phase retarder and/or a $\lambda/4$ phase retarder. The polarizer may be of a film type or a liquid crystal coating type. The film type may include a stretchable synthetic resin film, and the liquid crystal coating type may include liquid crystals arranged in a predetermined form. The phase retarder and the polarizer may be implemented as one polarization film.

In an embodiment of the disclosure, the reflection prevention layer may include color filters. Arrangement of the color filters may be determined in consideration of colors of light beams generated by the plurality of pixels PX (refer to FIG. 3) included in the display panel DP. In this case, the reflection prevention layer may further include the light shielding pattern disposed between the color filters.

The display module DM may display the image IM according to an electrical signal and transmit/receive information on the external input. The display module DM may be defined by an active area AA and a non-active area NAA. The active area AA may be defined as an area through which the image IM is output from the display panel DP (that is, an area on which the image IM is displayed). Further, the active area AA may be defined as an area through which the input detection layer ISP detects the external input applied from the outside. In an embodiment, the active area AA of the display module DM may correspond to (or overlap) at least a portion of the display area DA.

The non-active area NAA is adjacent to the active area AA. The non-active area NAA may be an area on which the image IM is not substantially displayed. In an embodiment, the non-active area NAA may surround the active area AA, for example. However, this is illustratively illustrated, the non-active area NAA may be defined in various shapes, and the disclosure is not limited to an embodiment. In an embodiment, the non-active area NAA of the display module DM may correspond to (or overlap) at least a portion of the non-display area NDA.

The display device DD may further include a plurality of flexible films FF connected to the display panel DP. A driving chip DIC may be disposed (e.g., mounted) on each of the flexible films FF. In an embodiment of the disclosure, a source driving circuit 200 (refer to FIG. 3) includes the plurality of driving chips DIC, and the plurality of driving chips DIC may be disposed (e.g., mounted) on the plurality of flexible films FF, respectively.

The display device DD may further include at least one circuit board PCB coupled to the plurality of flexible films FF. In an embodiment of the disclosure, four circuit boards PCB are provided in the display device DD, but the number of circuit boards PCB is not limited thereto. Adjacent two circuit boards among the circuit boards PCB may be electrically connected to each other by a connection film CF. Further, at least one of the circuit boards PCB may be electrically connected to a main board. A driving controller 100 (refer to FIG. 3), a voltage generator 400 (refer to FIG. 3), or the like may be arranged on at least one of the circuit boards PCB.

Although a structure in which the driving chips DIC are respectively disposed (e.g., mounted) on the flexible films FF is illustrated in FIG. 2, the disclosure is not limited thereto. In an embodiment, the driving chips DIC may be directly disposed (e.g., mounted) on the display panel DP, for example. In this case, a portion of the display panel DP, on which the driving chip DIC is disposed (e.g., mounted), may be bent and disposed on a rear surface of the display module DM.

The input detection layer ISP may be electrically connected to the circuit board PCB through the flexible films FF. However, an embodiment of the disclosure is not limited thereto. That is, the display module DM may additionally include a separate flexible film for electrically connecting the input detection layer ISP to the circuit board PCB.

The display device DD may further include a housing EDC in which the display module DM is accommodated. The housing EDC may be coupled to the window WM and define an exterior of the display device DD. The housing EDC absorbs an impact applied from the outside, prevents foreign substances/moisture from penetrating into the display module DM, and thus protects components accommodated in the housing EDC. In an embodiment of the disclosure, the housing EDC may be provided in a form in which a plurality of accommodating members are coupled.

The display device DD in an embodiment may further include an electronic module including various functional modules for operating the display module DM, a power supply module (e.g., a battery) that supplies power desired for the overall operation of the display device DD, a bracket that is coupled to the display module DM and/or the housing EDC and divides an inner space of the display device DD, or the like.

Figure 3:
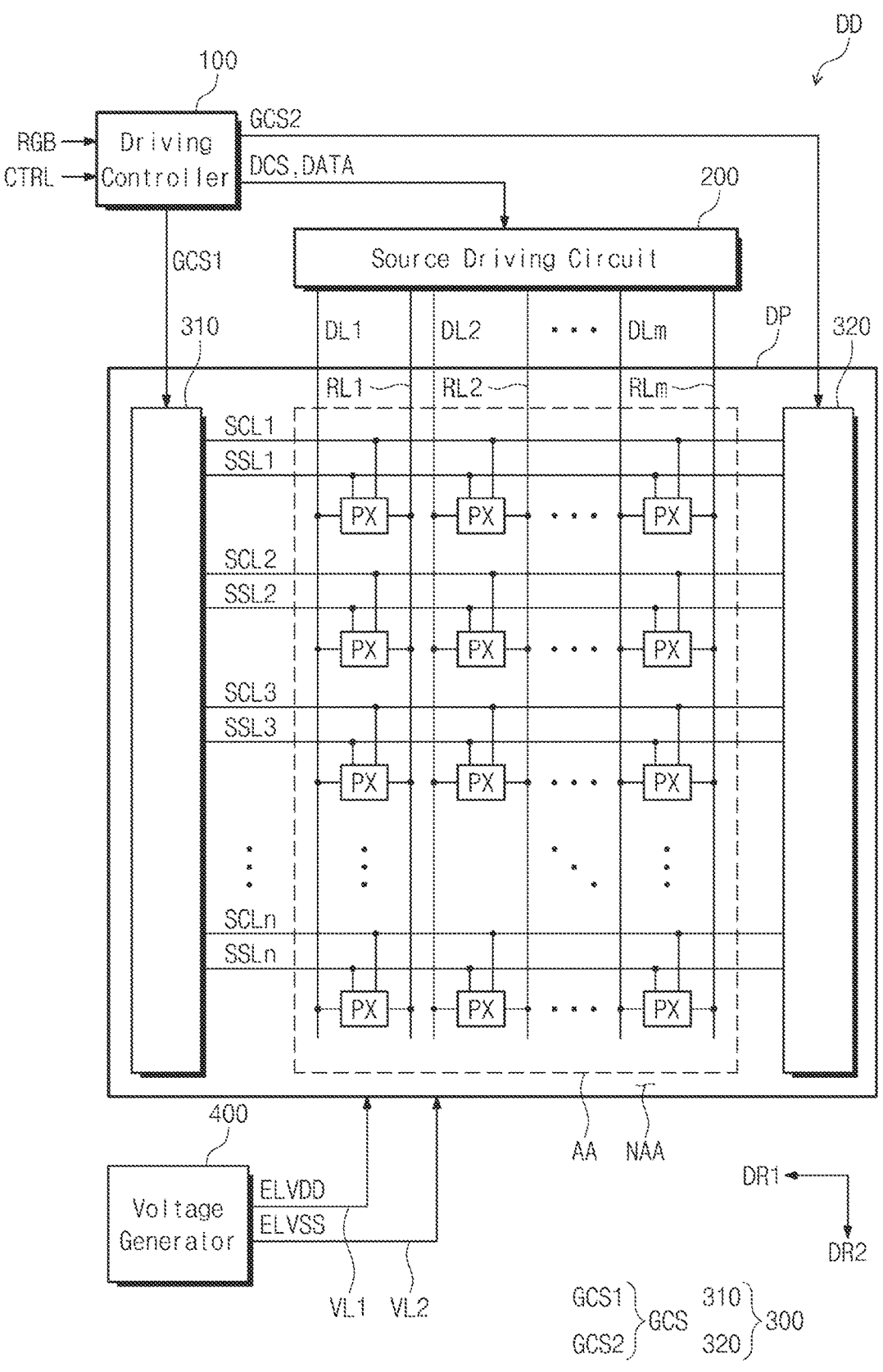
FIG. 3 is a block diagram of an embodiment of the display device according to the disclosure.

FIG. 3 is a block diagram of an embodiment of the display device according to the disclosure.

Referring to FIG. 3, the display device DD includes the driving controller 100, the source driving circuit 200, a scan driving circuit 300, the voltage generator 400, and the display panel DP. In an embodiment of the disclosure, the source driving circuit 200 may include a data driver and a sensing driver.

The display panel DP includes driving scan lines SCL1 to SCLn, sensing scan lines SSL1 to SSLn, data lines DL1 to DLm, a plurality of sensing lines RL1 to RLm, and pixels PX. Here, n and m are natural numbers. The display panel DP may be divided into the active area AA and the non-active area NAA. The pixels PX may be arranged in the active area AA, and the scan driving circuit 300 may be arranged in the non-active area NAA.

The driving scan lines SCL1 to SCLn and the sensing scan lines SSL1 to SSLn extend parallel to the first direction DR1, and are spaced apart from each other in the second direction DR2. The second direction DR2 may be a direction intersecting the first direction DR1. The data lines DL1 to DLm extend from the source driving circuit 200 parallel to the second direction DR2 and are spaced apart from each other in the first direction DR1. The sensing lines RL1 to RLm may extend in the second direction DR2 and may be arranged in the first direction DR1.

The plurality of pixels PX is electrically connected the driving scan lines SCL1 to SCLn, the sensing scan lines SSL1 to SSLn, the data lines DL1 to DLm, and the sensing lines RL1 to RLm. Each of the plurality of pixels PX may be electrically connected to two scan lines. However, the number of scan lines connected to each pixel PX is not limited thereto. In an embodiment, each of the plurality of pixels PX may be electrically connected to one or three scan lines, for example.

Each of the plurality of pixels PX includes a light-emitting element ED (refer to FIG. 4A) and a pixel circuit unit PXC (refer to FIG. 4A) that controls light emission of the light-emitting element ED. The pixel circuit unit PXC may include a plurality of transistors and a capacitor.

The driving controller 100 receives an input image signal RGB and a control signal CTRL from a main controller (e.g., a micro-controller or graphic controller). The driving controller 100 may convert the input image signal RGB to generate image data DATA.

The driving controller 100 generates a scan control signal GCS and a source control signal DCS on the basis of the control signal CTRL. The source driving circuit 200 receives the source control signal DCS and the image data DATA from the driving controller 100 and converts the image data DATA into data signals in response to the source control signal DCS. The source driving circuit 200 outputs data signals to the plurality of data lines DL1 to DLm. The data signals may be analog voltages corresponding to grayscale values of the image data DATA.

The source driving circuit 200 is connected to the plurality of sensing lines RL1 to RLm. The source driving circuit 200 may further receive a sensing control signal from the driving controller 100 and sense characteristics of elements included in each pixel PX of the display panel DP in response to the sensing control signal.

In an embodiment of the disclosure, the source driving circuit 200 may be formed in the form of at least one chip. In an embodiment, the source driving circuit 200 may be disposed inside the driving chips DIC illustrated in FIG. 2, for example.

The scan driving circuit 300 receives the scan control signal GCS from the driving controller 100. The scan driving circuit 300 may output scan signals in response to the scan control signal GCS. The scan driving circuit 300 may be embedded in the display panel DP. When the scan driving circuit 300 is embedded in the display panel DP, the scan driving circuit 300 may include transistors formed through the same process as that of the pixel circuit unit PXC.

The scan driving circuit 300 may generate a plurality of driving scan signals and a plurality of sensing scan signals in response to the scan control signal GCS. The plurality of driving scan signals are applied to the driving scan lines SCL1 to SCLn, and the plurality of sensing scan signals are applied to the sensing scan lines SSL1 to SSLn.

In an embodiment of the disclosure, the scan driving circuit 300 includes a first scan driving circuit 310 and a second scan driving circuit 320. The first scan driving circuit 310 is disposed on a left side of the active area AA, and the second scan driving circuit 320 is disposed on a right side of the active area AA. The first scan driving circuit 310 receives a first scan control signal GCS1 from the driving controller 100, and the second scan driving circuit 320 receives a second scan control signal GCS2 from the driving controller 100. The first scan driving circuit 310 may generate the plurality of driving scan signals and the plurality of sensing scan signals in response to the first scan control signal GCS1. The second scan driving circuit 320 may generate the plurality of driving scan signals and the plurality of sensing scan signals in response to the second scan control signal GCS2.

Although FIG. 3 illustrates a structure in which the first and second scan driving circuits 310 and 320 are arranged on the left and right sides of the active area AA, the disclosure is not limited thereto. The scan driving circuit 300 may include only one of the first and second scan driving circuits 310 and 320.

Each of the plurality of pixels may receive a first driving voltage ELVDD and a second driving voltage ELVSS.

The voltage generator 400 generates voltages desired for operating the display panel DP. In an embodiment of the disclosure, the voltage generator 400 generates the first driving voltage ELVDD and the second driving voltage ELVSS desired for operating the display panel DP. The first driving voltage ELVDD and the second driving voltage ELVSS may be provided to the display panel DP through a first driving voltage line VL1 and a second driving voltage line VL2.

The voltage generator 400 generates not only the first driving voltage ELVDD and the second driving voltage ELVSS but also various voltages (e.g., a gamma reference voltage, a data driving voltage, a gate-on voltage, a gate-off voltage, or the like) desired for operating the source driving circuit 200 and the scan driving circuit 300.

Figure 4A:
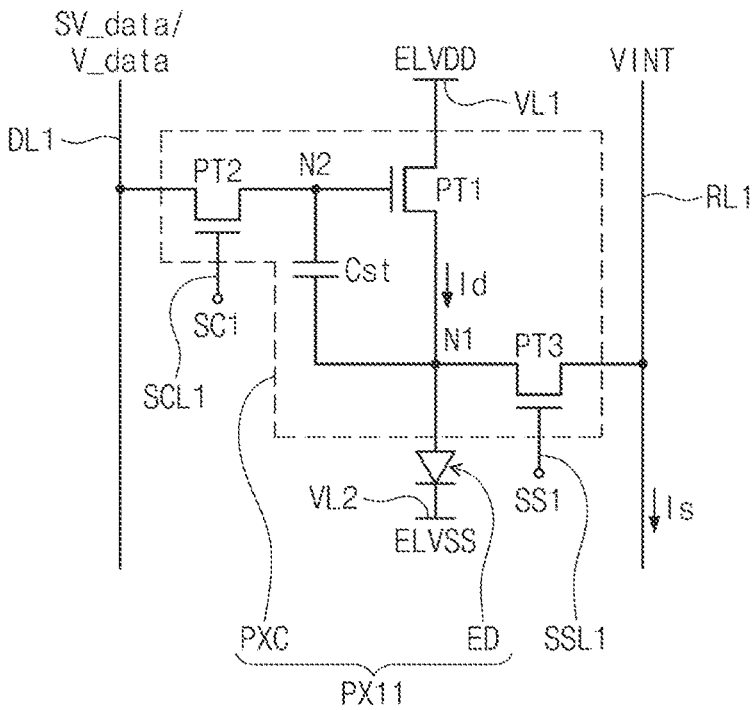
FIG. 4A is a circuit diagram illustrating an embodiment of a pixel according to the disclosure.
Figure 4B:
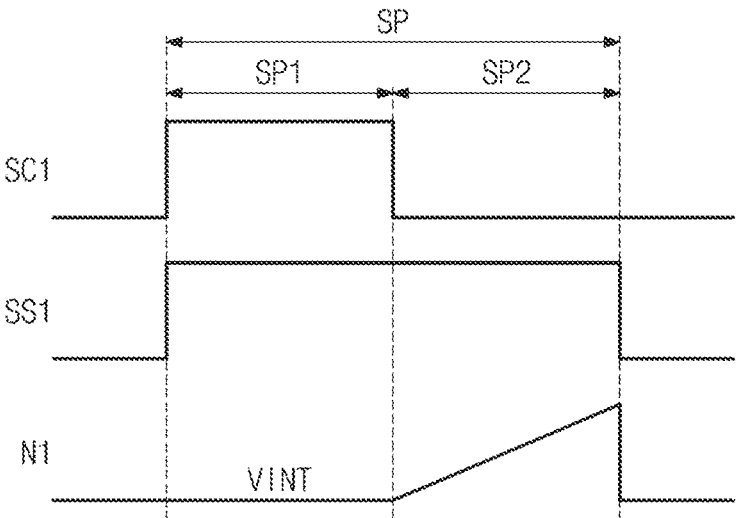
FIG. 4B is a waveform diagram for describing an operation and a sensing section of the pixel illustrated in FIG. 4A.

FIG. 4A is a circuit diagram illustrating an embodiment of a pixel according to the disclosure, and FIG. 4B is a waveform diagram for describing an operation and a sensing section of the pixel illustrated in FIG. 4A.

FIG. 4A is an equivalent circuit diagram of a first pixel PX11 among the plurality of pixels PX illustrated in FIG. 1. Since the plurality of pixels PX have the same circuit structure, only a circuit structure of the first pixel PX11 will be described, and a detailed description of the other pixels will be omitted.

Referring to FIG. 4A, the first pixel PX11 is connected to the first data line DL1, the first driving scan line SCL1, the first sensing scan line SSL1, and the first sensing line RL1.

The first pixel PX11 includes the light-emitting element ED and the pixel circuit unit PXC. The light-emitting element ED may be a light-emitting diode. In an embodiment of the disclosure, the light-emitting element ED may be an organic light-emitting diode including an organic light-emitting layer. The light-emitting element ED may be one of a red light-emitting diode that outputs a red light beam, a green light-emitting diode that outputs a green light beam, and a blue light-emitting diode that outputs a blue light beam.

The pixel circuit unit PXC includes first to third transistors PT1, PT2, and PT3 and a capacitor Cst. The first to third transistors PT1, PT2, and PT3 may be an oxide transistor having an oxide semiconductor layer. Each of the first to third transistors PT1, PT2, and PT3 may be an N-type transistor. However, the disclosure is not limited thereto. Each of the first to third transistors PT1, PT2, and PT3 may be a P-type transistor. In an alternative embodiment, some of the first to third transistors PT1, PT2, and PT3 may be N-type transistors, and the other thereof may be P-type transistors. Further, at least one of the first to third transistors PT1, PT2, and PT3 may also be a transistor having a low-temperature polycrystalline silicon ("LTPS") semiconductor layer.

A configuration of the pixel circuit unit PXC according to the disclosure is not limited to an embodiment illustrated in FIG. 4A. The pixel circuit unit PXC illustrated in FIG. 4A is merely one of embodiments, and the configuration of the pixel circuit unit PXC may be modified and implemented. In an embodiment, in the pixel circuit unit PXC, the third transistor PT3 may be omitted, for example.

The first transistor PT1 is connected between the first driving voltage line VL1 that receives the first driving voltage ELVDD and the light-emitting element ED. The first transistor PT1 includes a first electrode connected to the first driving voltage line VL1, a second electrode electrically connected to an anode of the light-emitting element ED, and a third electrode connected to one end of the capacitor Cst. Here, a contact point at which the anode of the light-emitting element ED and the second electrode of the first transistor PT1 may be also referred to as a first node N1. In the specification, the wording "a transistor is connected to a signal line" means that "one of the first electrode, the second electrode, and the third electrode of the transistor has an integral shape with the signal line or connected to the signal line through a connection electrode." Further, the wording "a transistor is electrically connected to another transistor" means that "one of the first electrode, the second electrode, and the third electrode of the transistor has an integral shape with one of a first electrode, a second electrode, and a third electrode of another transistor or is connected to the one thereof through a connection electrode."

The first transistor PT1 may receive a data voltage V_data transmitted by the first data line DL1 according to a switching operation of the second transistor PT2 and supply a driving current to the light-emitting element ED.

The second transistor PT2 is connected between the first data line DL1 and the third electrode of the first transistor PT1. The second transistor PT2 includes a first electrode connected to the first data line DL1, a second electrode connected to the third electrode of the first transistor PT1, and a third electrode connected to the first driving scan line SCL1. Here, a contact point at which the second electrode of the second transistor PT2 and the third electrode of the first transistor PT1 are connected to each other may be also referred to as a second node N2. The second transistor PT2 may be turned on according to a first driving scan signal SC1 received through the first driving scan line SCL1 and transmit the data voltage V_data transmitted from the first data line DL1 to the third electrode of the first transistor PT1.

The third transistor PT3 is connected between the second electrode of the first transistor PT1 and the first sensing line RL1. The third transistor PT3 includes a first electrode connected to the first node N1, a second electrode connected to the first sensing line RL1, and a third electrode connected to the first sensing scan line SSL1. The third transistor PT3 may be turned on according to a first sensing scan signal SS1 received through the first sensing scan line SSL1 and may electrically connect the first sensing line RL1 and the first node N1.

One end of the capacitor Cst is connected to the second node N2, and the other end thereof is connected to the first node N1. A cathode of the light-emitting element ED may be connected to the second driving voltage line VL2 that transmits the second driving voltage ELVSS. The second driving voltage ELVSS may have a voltage level lower than that of the first driving voltage ELVDD.

The light-emitting element ED may include an anode connected to the second electrode (or the first node N1) of the first transistor PT1 and a cathode that receives the second driving voltage ELVSS. The light-emitting element ED may generate a light beam corresponding to the amount of current supplied from the first transistor PT1.

Referring to FIGS. 4A and 4B, during a sensing period SP, the first driving scan signal SC1 may be applied to the first driving scan line SCL1, and the first sensing scan signal SS1 may be applied to the first sensing scan line SSL1. The duration of the sensing period SP may be greater than the duration of an active period of at least one sensing scan signal (e.g., the first sensing scan signal SS1) among the sensing scan signals. An active period of the first driving scan signal SC1 may overlap an active period of the first sensing scan signal SS1. In an embodiment of the disclosure, the duration of the active period of the first sensing scan signal SS1 may be greater than (e.g., twice) the duration of the active period of the first driving scan signal SC1. In an embodiment of the disclosure, the active period may be defined as a high level period.

The sensing period SP includes a writing period SP1 during which the first driving scan signal SC1 and the first sensing scan signal SS1 are simultaneously activated and a readout period SP2 during which only the first sensing scan signal SS1 is activated.

During the writing period SP1, the second transistor PT2 may be turned on in response to the first driving scan signal SC1, and the third transistor PT3 may be turned on in response to the first sensing scan signal SS1.

The sensing data voltage SV_data may be applied to the second node N2 (that is, the third electrode of the first transistor PT1) through the first data line DL1 and the turned-on second transistor PT2. The sensing data voltage SV_data may be a voltage that is applied to the data lines DL1 to DLm during the sensing period SP and is set for current sensing. An initialization voltage VINT may be applied to the first node N1 (that is, the second electrode of the first transistor PT1 or the anode of the light-emitting element ED) through the first sensing line RL1 and the turned-on third transistor PT3. The initialization voltage VINT may be a voltage for initializing the first node N1.

A voltage between the first node N1 and the second node N2 may be set as a difference between the sensing data voltage SV_data and the initialization voltage VINT. Charges corresponding to the difference between the sensing data voltage SV_data and the initialization voltage VINT may be charged in the capacitor Cst. The voltage between the first node N1 and the second node N2 may be defined as a voltage between a gate and a source of the first transistor PT1.

Thereafter, the writing period SP1 is terminated, and thus the first driving scan signal SC1 is deactivated, and the second transistor PT2 may be turned off. Even when the second transistor PT2 is turned off, the voltage between the first node N1 and the second node N2 may be maintained by the capacitor Cst during the readout period SP2.

Since the voltage between the first node N1 and the second node N2 is greater than a threshold voltage of the first transistor PT1, a current (hereinafter, also referred to as a drain current Id) may flow in the first transistor PT1 during the readout period SP2. During the readout period SP2, a potential of the first node N1 may be boosted by the drain current Id while maintaining the voltage between the first node N1 and the second node N2. During the readout period SP2, the drain current Id may be output to the first sensing line RL1 through the turned-on third transistor PT3. A current output to the first sensing line RL1 may be also referred to as a sensing current Is.

Figure 5:
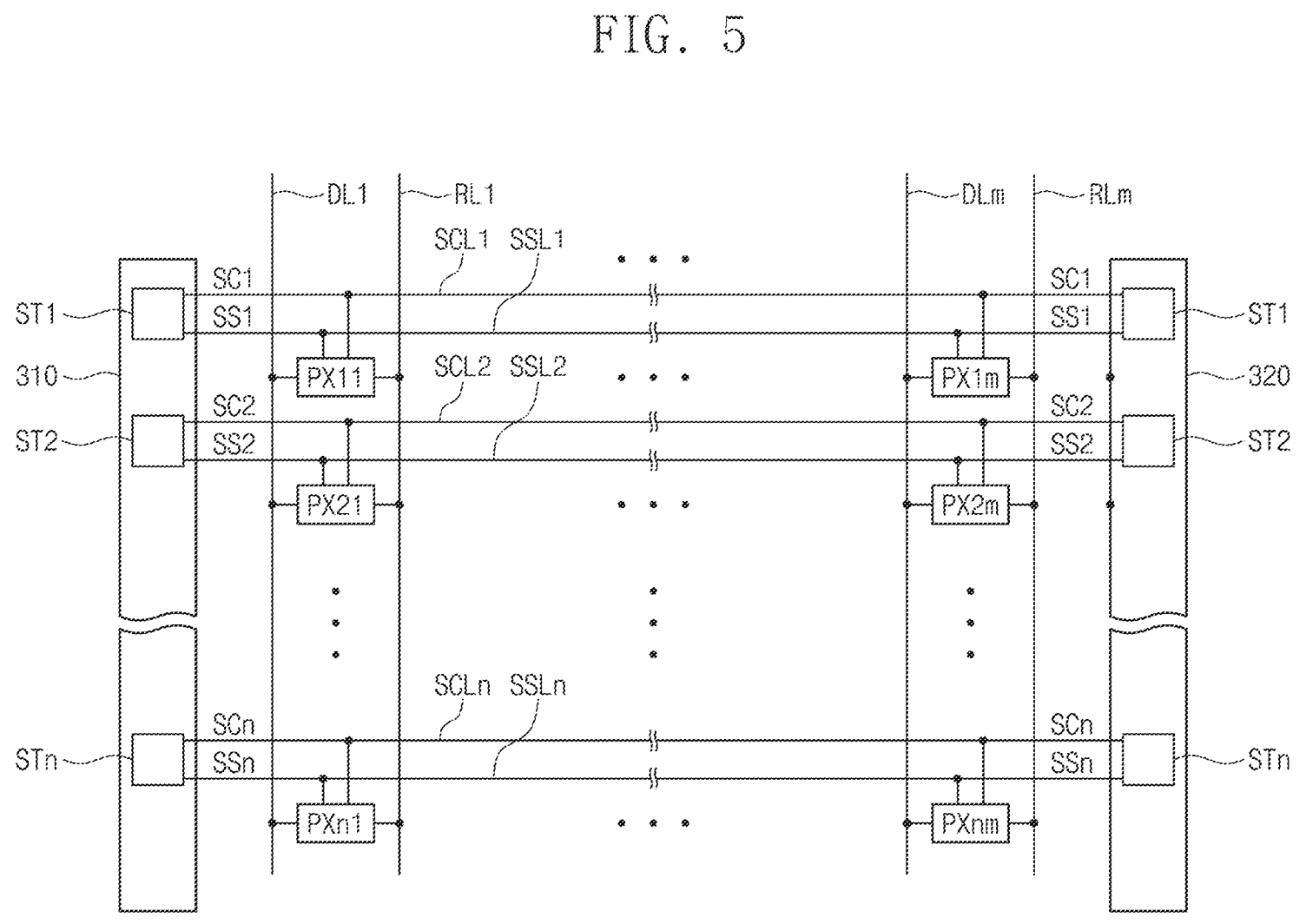
Figure 6:
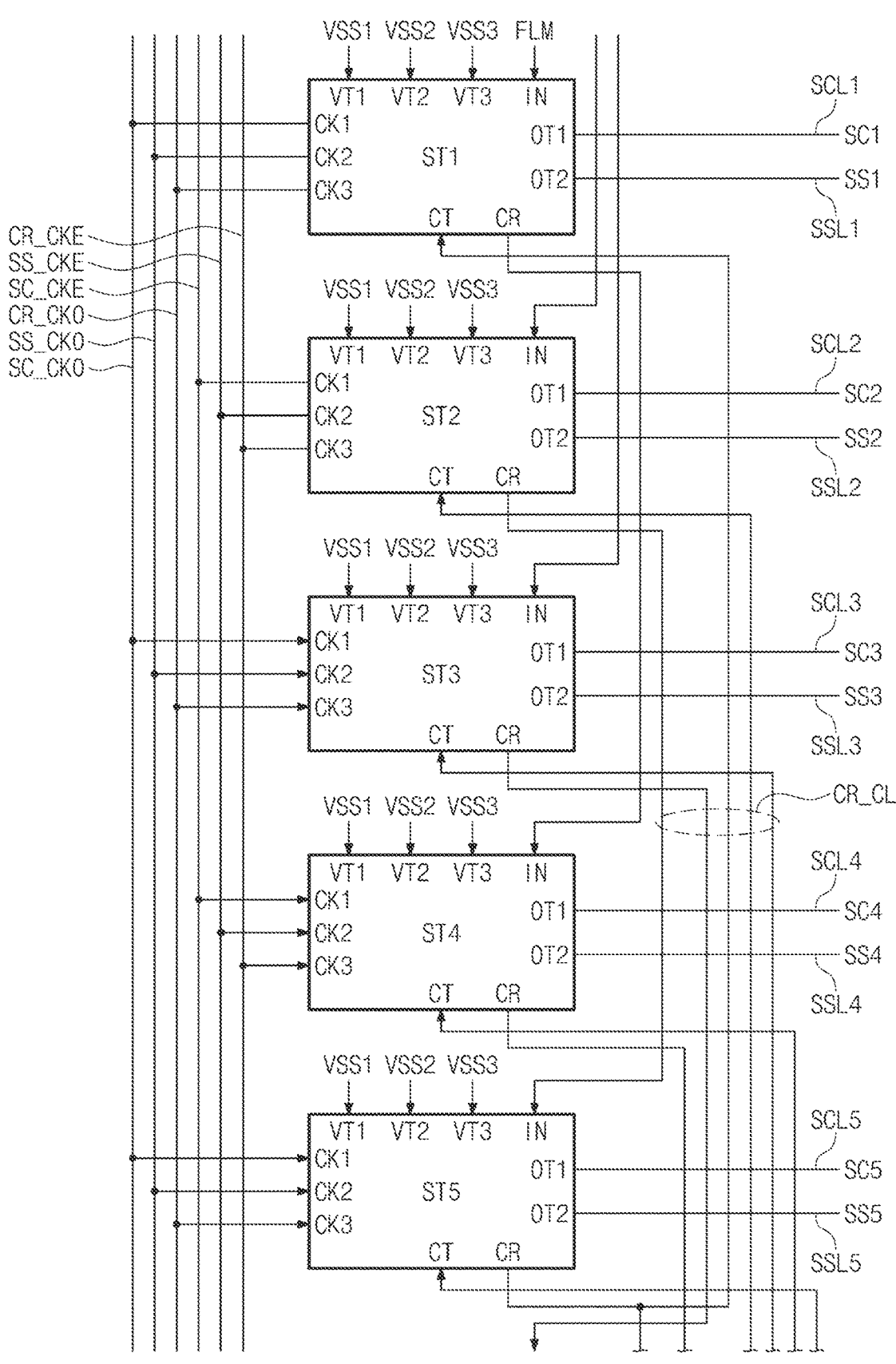
FIG. 6 is a block diagram of a first scan driving circuit illustrated in FIG. 5.

FIG. 5 is a block diagram illustrating an embodiment of a scan driving circuit and the pixel according to the disclosure, and FIG. 6 is a block diagram of a first scan driving circuit illustrated in FIG. 5.

Referring to FIG. 5, pixels (e.g., PX11 to PX1m) arranged on the same row among the pixels PX11 to PXnm are connected to two scan lines (e.g., the first driving scan line SCL1 and the first sensing scan line SSL1). Pixels (e.g., PX11 to PXn1) arranged on the same column among the pixels PX11 to PXnm are connected to one data line (e.g., the first data line DL1) and one sensing line (e.g., the first sensing line RL1).

The first scan driving circuit 310 is connected to sides of the scan lines SCL1 to SCLn and SSL1 to SSLn, and the second scan driving circuit 320 is connected to the other sides of the scan lines SCL1 to SCLn and SSL1 to SSLn.

Each of the first and second scan driving circuits 310 and 320 may include a plurality of stages ST1 to STn connected to each other. In an embodiment, each of the plurality of stages ST1 to STn may output a corresponding driving scan signal and a corresponding sensing scan signal. In an embodiment, the first stage is connected to the first driving scan line SCL1 and the first sensing scan line SSL1 and outputs the first driving scan signal SC1 and the first sensing scan signal SS1 to the first driving scan line SCL1 and the first sensing scan line SSL1, for example. However, the disclosure is not limited thereto. In an alternative embodiment, each of the first and second scan driving circuits 310 and 320 may independently include stages that output the driving scan signals and stages that output sensing scan signals.

For convenience of description, FIG. 6 illustrates only five stages (ST1 to ST5), but the other stages may have a similar configuration.

Referring to FIG. 6, each of the stages ST1 to ST5 may include an input terminal IN, a control terminal CT, a carry terminal CR, a first output terminal OT1, and a second output terminal OT2. Further, each of the stages ST1 to ST5 may include first to third clock terminals CK1 to CK3 and first to third voltage terminals VT1 to VT3.

The input terminal IN may receive a start signal FLM or a previous carry signal output from the carry terminal CR of one of previous stages. The start signal FLM may be a dummy carry signal output from a dummy stage preceding the first stage ST1 or a signal provided from the driving controller 100 (refer to FIG. 3). The control terminal CT may receive a next carry signal output from the carry terminal CR of one of next stages. Here, wirings connecting the carry terminal CR of each stage to the input terminal IN of one of the next stages and the control terminal CT of one of the previous stages may be defined as carry wirings CR_CL.

Each of the stages ST1 to ST5 may receive three clock signals through the first to third clock terminals CK1, CK2, and CK3. The first clock terminal CK1 of each of odd-numbered stages ST1, ST3, and ST5 among the stages ST1 to ST5 may receive a first driving clock signal SC_CKO, the second clock terminal CK2 thereof may receive a first sensing clock signal SS_CKO, and the third clock terminal CK3 thereof may receive a first carry clock signal CR_CKO. The first clock terminal CK1 of each of even-numbered stages ST2 and ST4 may receive a second driving clock signal SC_CKE, the second clock terminal CK2 thereof may receive a second sensing clock signal SS_CKE, and the third clock terminal CK3 thereof may receive a second carry clock signal CR_CKE.

The first and second driving clock signals SC_CKO and SC_CKE may have the same period and have different phases. In an embodiment, the first and second driving clock signals SC_CKO and SC_CKE may have phases inverted from each other. The first and second sensing clock signals SS_CKO and SS_CKE may have the same period and have different phases. In an embodiment, the first and second sensing clock signal SS_CKO and SS_CKE may have phases inverted from each other. The first and second carry clock signals CR_CKO and CR_CKE may have the same period and have different phases. In an embodiment, the first and second carry clock signals CR_CKO and CR_CKE may have phases inverted from each other.

The first voltage terminal VT1, the second voltage terminal VT2, and the third voltage terminal VT3 may receive first to third low voltages VSS1, VSS2, and VSS3, respectively. The first to third low voltages VSS1, VSS2, and VSS3 may have a direct current ("DC") voltage level. The first to third low voltages VSS1, VSS2, and VSS3 may have different voltage levels.

The stages ST1 to ST5 output the driving scan signals SC1 to SC5 and the sensing scan signals SS1 to SS5 to the driving scan lines SCL1 to SCL5 and the sensing scan lines SSL1 to SSL5, respectively. In detail, the first and second output terminals OT1 and OT2 of the first stage ST1 are connected to the first driving scan line SCL1 and the first sensing scan line SSL1, respectively, and output the first driving scan signal SC1 and the first sensing scan signal SS1 to the first driving scan line SCL1 and the first sensing scan line SSL1, respectively. The first and second output terminals OT1 and OT2 of the second stage ST2 are connected to the second driving scan line SCL2 and the second sensing scan line SSL2, respectively, and output the second driving scan signal SC2 and the second sensing scan signal SS2 to the second driving scan line SCL2 and the second sensing scan line SSL2, respectively.

Figure 7:
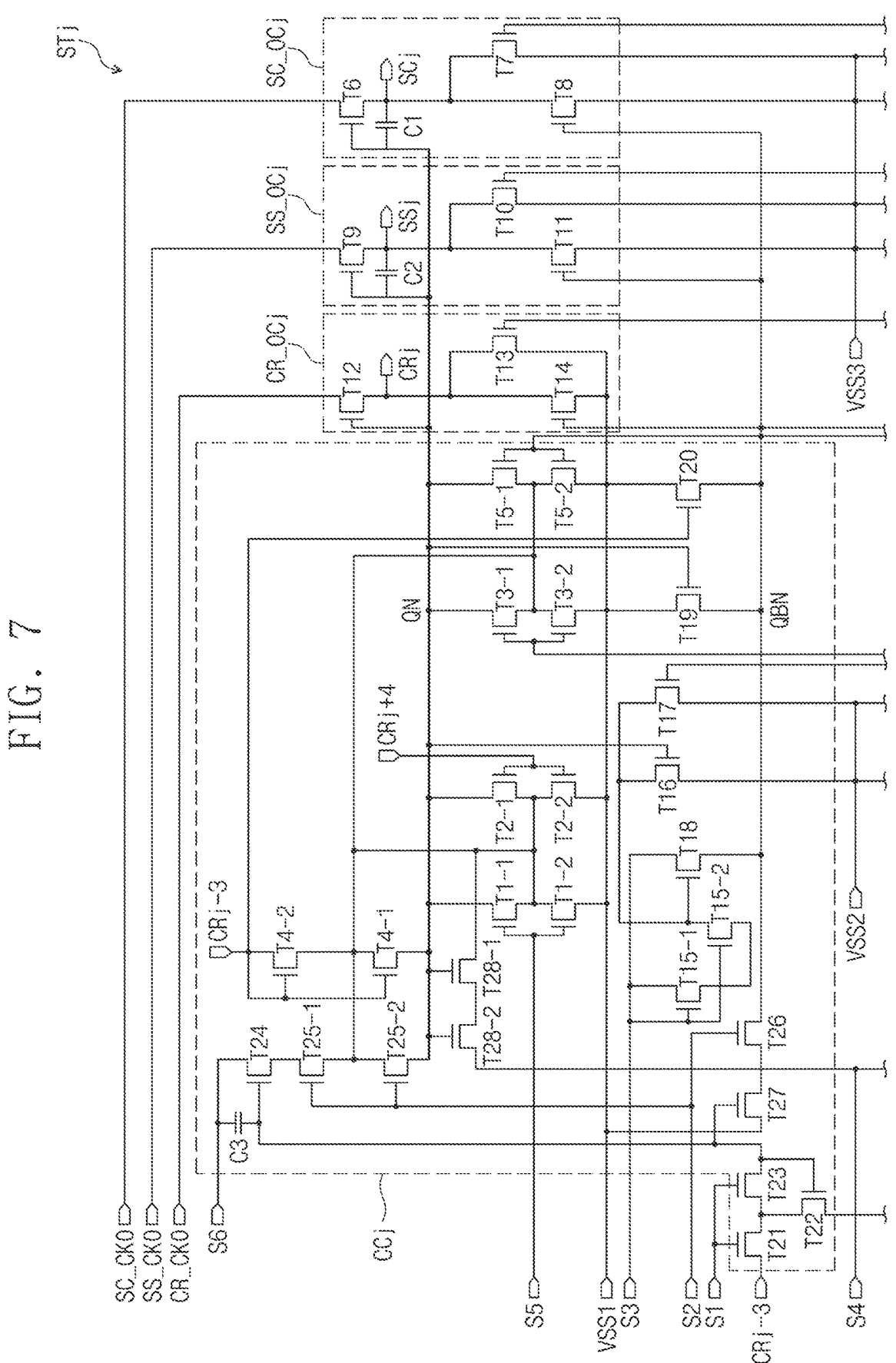
FIG. 7 is a circuit diagram of an embodiment of a $j^{th}$ stage according to the disclosure.

FIG. 7 is a circuit diagram of an embodiment of a $j^{th}$ stage according to the disclosure.

Referring to FIG. 7, a circuit configuration of a $j^{th}$ stage STj among the stages ST1 to STn (refer to FIG. 5) will be described. Since the stages ST1 to STn have the same circuit configuration, a description of the circuit configuration of the other stages ST1 to STn will be omitted. Here, j may be a natural number greater than 1 and equal to or less than n.

Referring to FIGS. 6 and 7, the $j^{th}$ stage STj includes a first scan output unit SC_OCj, a second scan output unit SS_OCj, a carry output unit CR_OCj, and a control unit CCj.

The first scan output unit SC_OCj includes first to third buffer transistors T6, T7, and T8 and a first capacitor C1 and is connected to the first output terminal OT1, the first clock terminal CK1, and the third voltage terminal VT3. Thus, the first scan output unit SC_OCj receives the first driving clock signal SC_CKO through the first clock terminal CK1 and outputs a $j^{th}$ driving scan signal SCj to the first output terminal OT1. The second scan output unit SS_OCj includes fourth to sixth buffer transistors T9, T10, and T11 and a second capacitor C2, and is connected to the second output terminal OT2, the second clock terminal CK2, and the third voltage terminal VT3. Thus, the second scan output unit SS_OCj receives the first sensing clock signal SS_CKO through the second clock terminal CK2 and outputs a $j^{th}$ sensing scan signal SSj to the second output terminal OT2. The carry output unit CR_OCj includes seventh to ninth buffer transistors T12, T13, and T14 and is connected to the carry terminal CR, the third clock terminal CK3 and the first voltage terminal VT1. Thus, the carry output unit CR_OCj receives the first carry clock signal CR_CKO through the third clock terminal CK3 and outputs a carry signal CRj to the carry terminal CR. In an embodiment, the $j^{th}$ stage STj may receive a previous carry signal CRj−3 and a subsequent carry signal CRj+4.

The control unit CCj is connected to the input terminal IN, the control terminal CT, and the first and second voltage terminals VT1 and VT2. The control unit CCj may be further connected to a plurality of signal terminals receiving signals S1 to S6. The control unit CCj includes a plurality of control transistors T1-1, T1-2, T2-1, T2-2, T3-1, T3-2, T4-1, T4-2, T5-1, T5-2, T15-1, T15-2, T16 to T24, T25-1, T25-2, T26, T27, T28-1, and T28-2 and a third capacitor C3.

The control unit CCj includes a first control node QN and a second control node QBN. The first control node QN may be connected to a gate of the first buffer transistor T6, a gate of the fourth buffer transistor T9, and a gate of the seventh buffer transistor T12. The plurality of control transistors (T1-1, T1-2, T2-1, T2-2, T3-1, T3-2, T4-1, T4-2, T5-1, T5-2, T16, T19, T25-1, T25-2, T28-1, and T28-2) may be further connected to the first control node QN. A wiring connecting the plurality of control transistors T1-1, T1-2, T2-1, T2-2, T3-1, T3-2, T4-1, T4-2, T5-1, T5-2, T16, T19, T25-1, T25-2, T28-1, and T28-2 and the gates of the first, fourth, and seventh buffer transistors T6, T9, and T12 through the first control node QN may be also referred to as a first control wiring.

The second control node QBN may be connected to a gate of the third buffer transistor T8, a gate of the sixth buffer transistor T11, and a gate of the ninth buffer transistor T14. A plurality of control transistors T18, T19, T20, and T26 may be further connected to the second control node QBN. A wiring connecting the plurality of control transistors T18, T19, T20, and T26 and the gates of the third, sixth, and ninth buffer transistors T8, T11, and T14 through the second control node QBN may be also referred to as a second control wiring.

FIG. 7 illustratively illustrates a case in which j is an odd number. Some transistors of the $j^{th}$ stage STj may be connected to a $(j+1)^{th}$ stage (that is, an even-numbered stage).

Each of the plurality of buffer transistors T6 to T14 and the plurality of control transistors T1-1, T1-2, T2-1, T2-2, T3-1, T3-2, T4-1, T4-2, T5-1, T5-2, T15-1, T15-2, T16 to T24, T25-1, T25-2, T26, T27, T28-1, and T28-2 may include an oxide semiconductor. That is, each of the plurality of buffer transistors T6 to T14 and the plurality of control transistors T1-1, T1-2, T2-1, T2-2, T3-1, T3-2, T4-1, T4-2, T5-1, T5-2, T15-1, T15-2, T16 to T24, T25-1, T25-2, T26, T27, T28-1, and T28-2 may be the same type transistor as the transistors PT1 to PT3 (refer to FIG. 4A) of the pixel circuit unit PXC (refer to FIG. 4A).

Figure 8A:
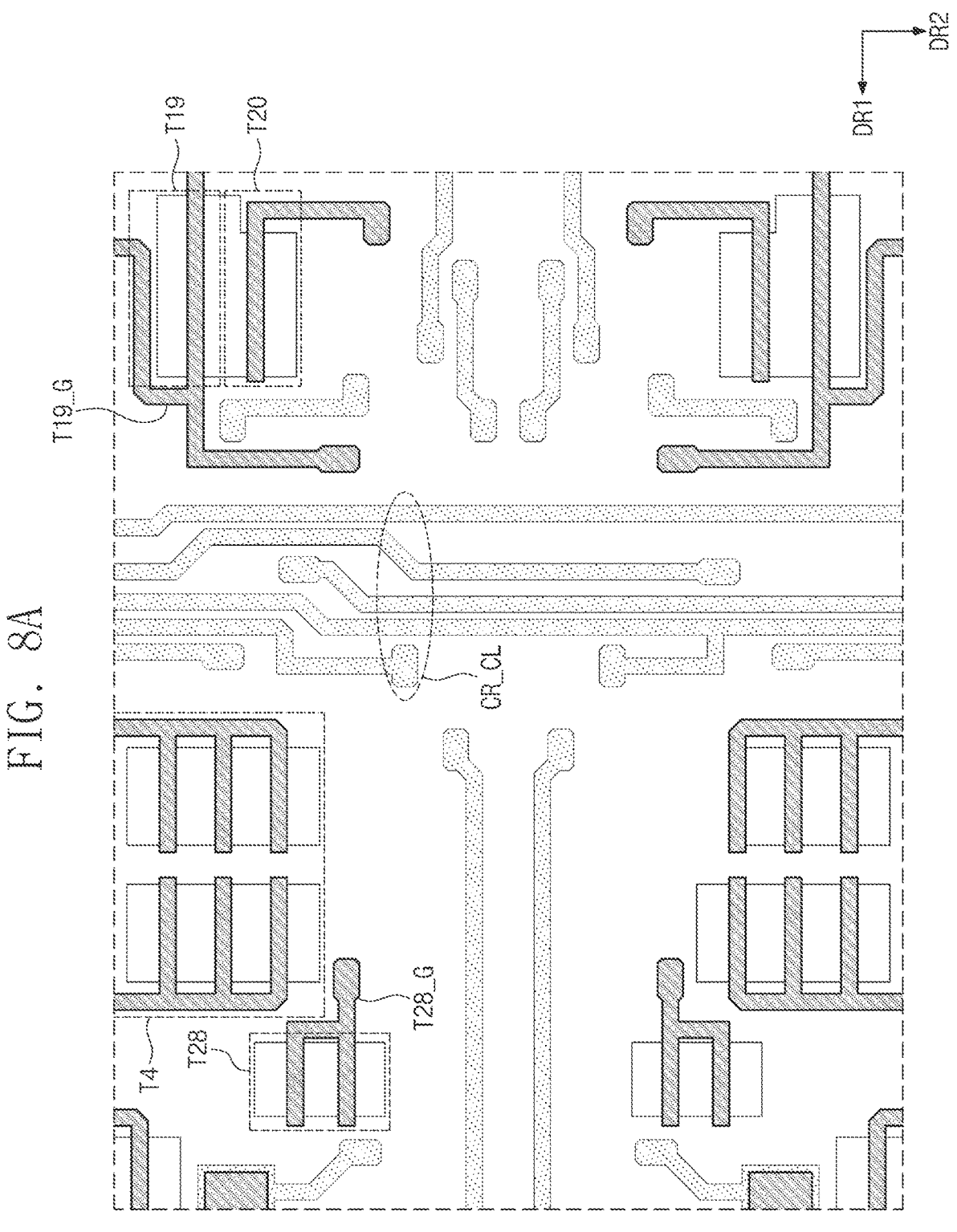
FIGS. 8A and 8B are plan views illustrating an embodiment of a layout of a portion of the scan driving circuit according to the disclosure.
Figure 8B:
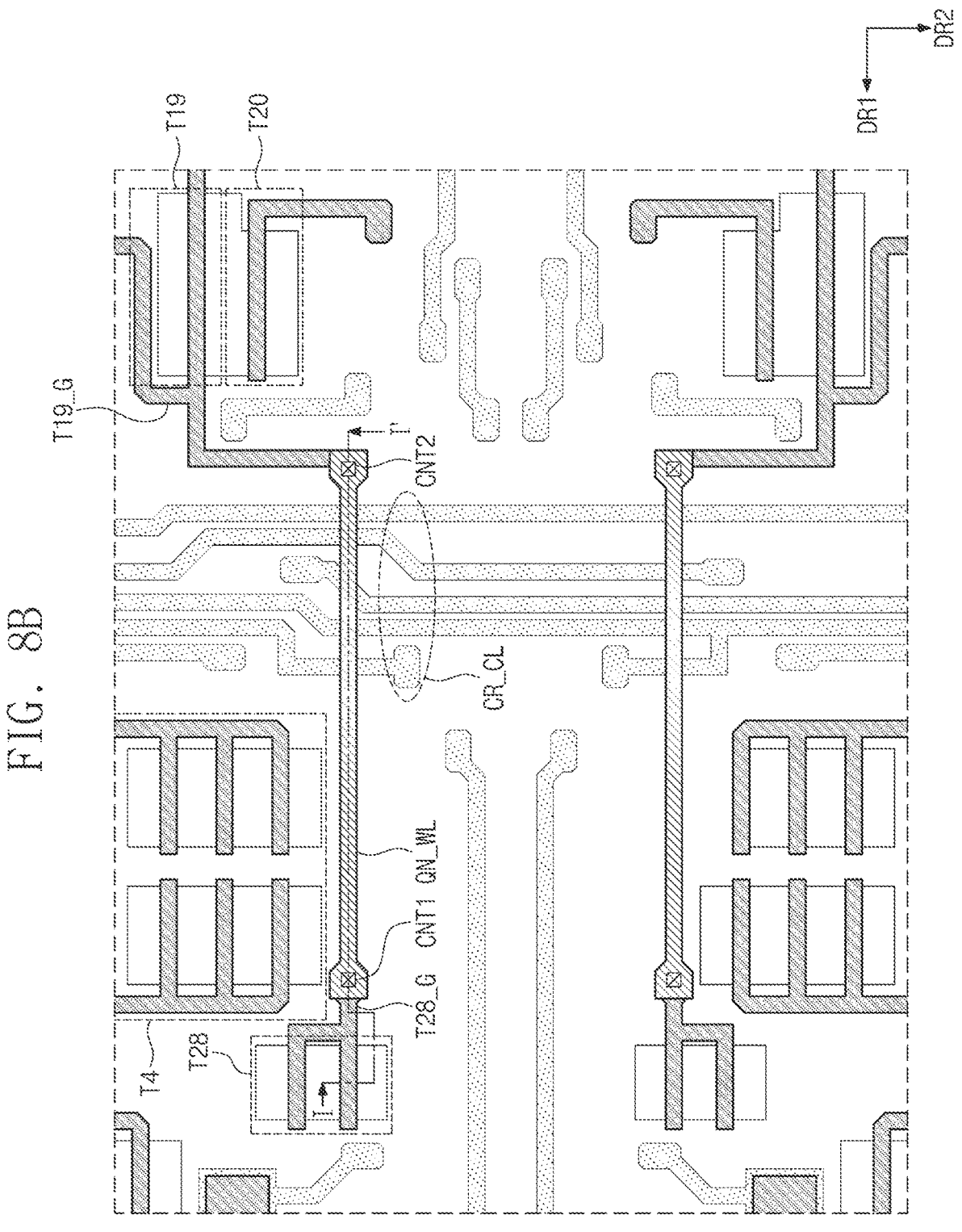
Figure 8C:
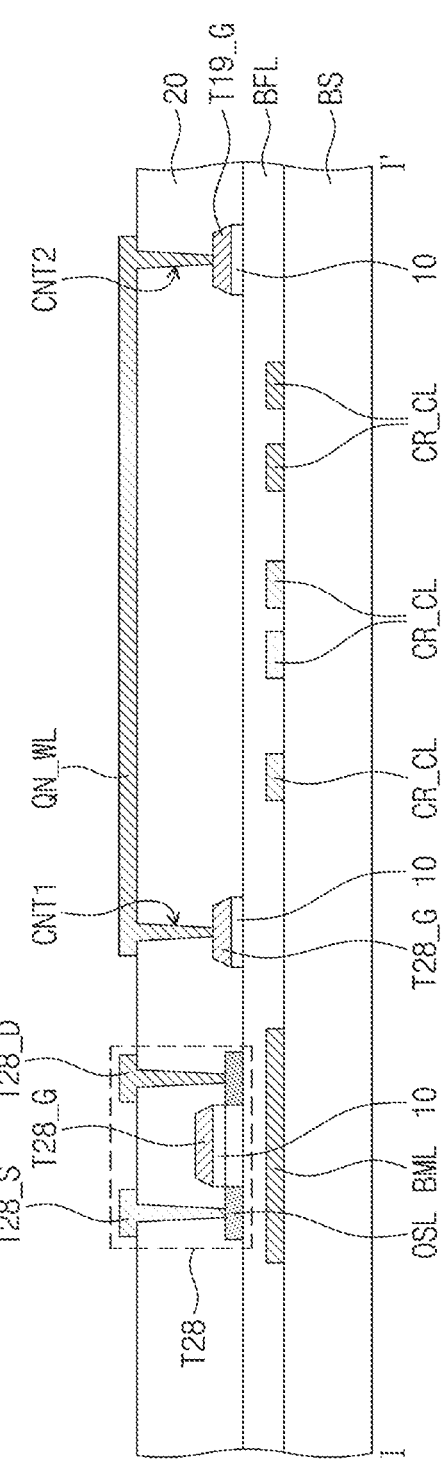
FIG. 8C is a cross-sectional view corresponding to line I-I' illustrated in FIG. 8B.

FIGS. 8A and 8B are plan views illustrating an embodiment of a layout of a portion of the scan driving circuit according to the disclosure. FIG. 8C is a cross-sectional view corresponding to line I-I' illustrated in FIG. 8B.

FIGS. 8A and 8B illustrate some control transistors T4, T19, T20, and T28 among the plurality of control transistors, a first control wiring QN_WL, and the carry wirings CR_CL. Here, the control transistor T28 includes the control transistors T28_1 and T28_2 illustrated in FIG. 7, and the control transistor T4 includes the control transistors T4_1 and T4_2 illustrated in FIG. 7.

Referring to FIGS. 8A and 8B, a gate T28_G of the control transistor T28 is connected to a gate T19_G of the control transistor T19 through the first control wiring QN_WL. The first control wiring QN_WL may extend in the first direction DR1 and intersect the carry wirings CR_CL extending in the second direction DR2. The first control wirings QN_WL may intersect the carry wirings CR_CL in an insulation state.

Referring to FIGS. 8B and 8C, a shielding electrode BML and the carry wirings CR_CL are arranged on an upper surface of a base layer BS. A buffer insulation layer BFL that covers the shielding electrode BML and the carry wirings CR_CL is disposed on the base layer BS. In an embodiment, the buffer insulation layer BFL may be disposed on a barrier layer. The buffer insulation layer BFL may include a silicon oxide layer and a silicon nitride layer. The silicon oxide layer and the silicon nitride layer may be alternately laminated.

A semiconductor pattern OSL is disposed on the buffer insulation layer BFL. The semiconductor pattern OSL may correspond to one of a plurality of patterns of a semiconductor layer disposed on the buffer insulation layer BFL. On a plane, the semiconductor pattern OSL may overlap the shielding electrode BML. Thus, the shielding electrode BML may prevent a light beam from being provided to the semiconductor pattern OSL.

The semiconductor pattern OSL may include a metal oxide. A metal oxide semiconductor may include a crystalline or amorphous oxide semiconductor. In an embodiment, the oxide semiconductor may include a metal of zinc (Zn), indium (In), gallium (Ga), tin (Sn), and titanium (Ti), a metal such as zinc (Zn), indium (In), gallium (Ga), tin (Sn), and titanium (Ti), or a metal oxide thereof, for example. The oxide semiconductor may include an indium-tin oxide ("ITO"), an indium-gallium-zinc oxide ("IGZO"), a zinc oxide (ZnO), an indium-zinc oxide (IZnO), a zinc-indium oxide (ZIO), an indium oxide (InO), a titanium oxide (TiO), an indium-zinc-tin oxide ("IZTO"), a zinc-tin oxide ("ZTO"), or the like.

The semiconductor pattern OSL may include a plurality of areas classified according to whether the metal oxide is reduced. An area (hereinafter, also referred to as a reduced area) in which the metal oxide is reduced has higher conductivity than that of an area (hereinafter, a non-reduced area) in which the metal oxide is not reduced. The reduced area substantially serves as a source/drain of a transistor or a signal line. The non-reduced area substantially corresponds to a semiconductor area (or a channel) of the transistor. In other words, a portion of the semiconductor pattern may be the semiconductor area of the transistor, another portion thereof may be the source/drain of the transistor, and still another portion thereof may be a signal transmission area.

The semiconductor pattern OSL may include a source area, a drain area, and a channel area (or the semiconductor area). The channel area is disposed between the source area and the drain area. The source area of the semiconductor pattern OSL may be connected to a source T28_S of the control transistor T28, and the drain area thereof may be connected to a drain T28_D of the control transistor T28.

A gate insulation layer 10 is disposed on the semiconductor pattern OSL. The gate insulation layer 10 overlaps the channel area. In an embodiment, the gate insulation layer 10 is not formed in the entirety of the base layer BS and overlaps a predetermined conductive pattern, which will be described below. However, the disclosure is not limited thereto, and in an embodiment of the disclosure, the gate insulation layer 10 may overlap the entirety of the base layer BS.

The gate T28_G of the control transistor T28 and the gate T19_G of the control transistor T19 are arranged on the gate insulation layer 10.

A first insulation layer 20 that covers the semiconductor pattern OSL, the gate T28_G of the control transistor T28, and the gate T19_G of the control transistor T19 is disposed on the buffer insulation layer BFL.

The source T28_S of the control transistor T28 and the drain T28_D of the control transistor T28 may be arranged on the first insulation layer 20. The source T28_S of the control transistor T28 and the drain T28_D of the control transistor T28 may be connected to the source area and the drain area of the semiconductor pattern OSL through a contact hole passing through the first insulation layer 20.

Further, the first control wiring QN_WL is disposed on the first insulation layer 20. The first control wiring QN_WL may be connected to the gate T28_G of the control transistor T28 and the gate T19_G of the control transistor T19 through first and second contact holes CNT1 and CNT2 passing through the first insulation layer 20. The first control wiring QN_WL overlaps the carry wirings CR_CL in a plan view, but two or more insulation layers (that is, the buffer insulation layer BFL and the first insulation layer 20) are arranged between the first control wiring QN_WL and the carry wirings CR_CL in a cross section. In an embodiment of the disclosure, the buffer insulation layer BFL may have a thickness of about 2500 angstroms (Å) or more, and the first insulation layer 20 may have a thickness of about 4500 Å or more. That is, a separation distance of about 7000 Å or more between the first control wiring QN_WL and the carry wirings CR_CL may be secured due to the buffer insulation layer BFL and the first insulation layer 20.

As two or more insulation layers (that is, the buffer insulation layer BFL and the first insulation layer 20) are arranged between the first control wiring QN_WL and the carry wirings CR_CL, the separation distance of about 7000 Å or more between the first control wiring QN_WL and the carry wirings CR_CL may be sufficiently secured. As a result, a phenomenon in which the insulation layers between the first control wiring QN_WL and the carry wirings CR_CL are destroyed due to an electric field generated during a process of manufacturing the display panel DP (refer to FIG. 3) and thus the two wirings short-circuiting each other may be prevented. Accordingly, the reliability of the scan driving circuit 300 (refer to FIG. 3) may be improved.

Figure 9A:
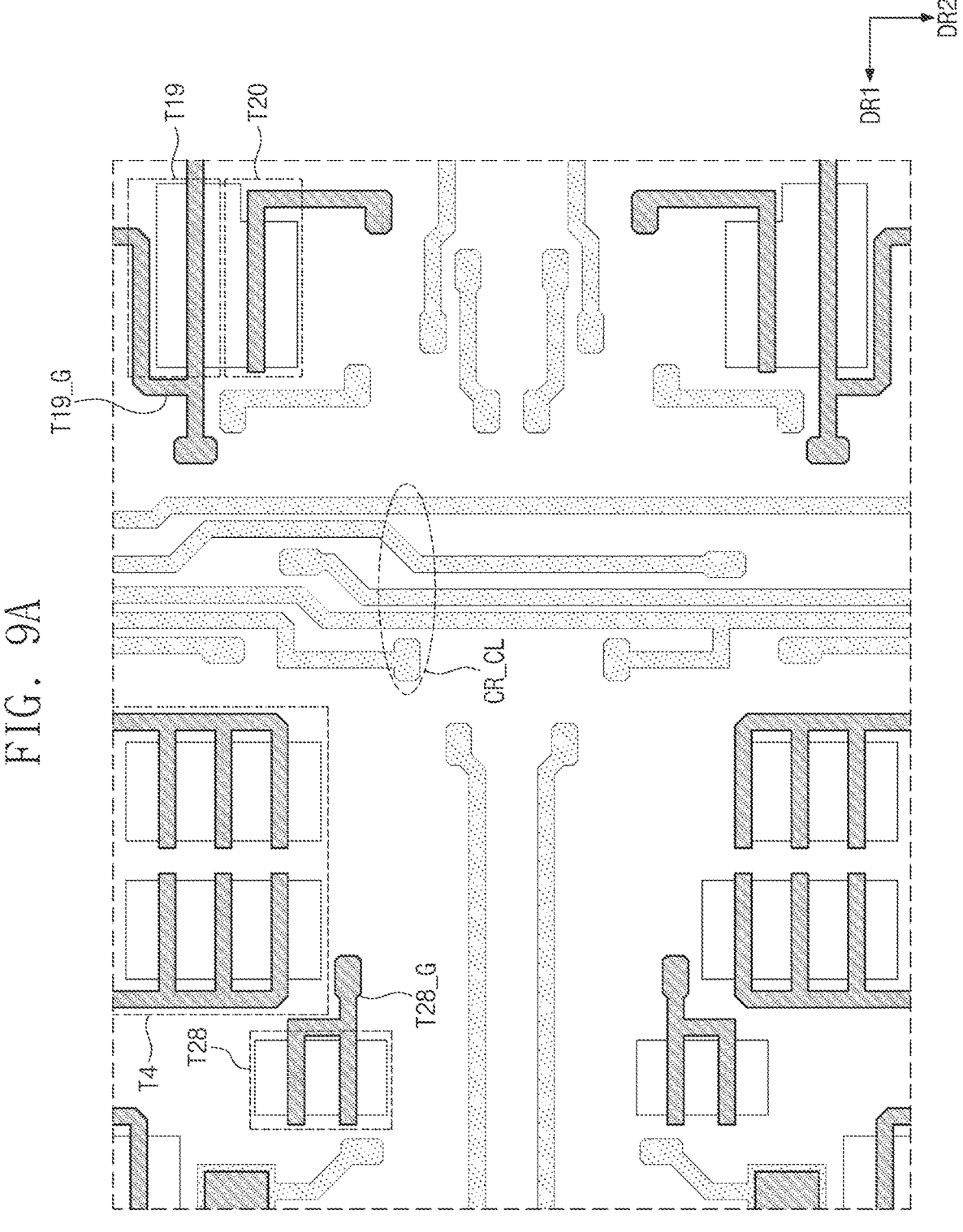
FIGS. 9A and 9B are plan views illustrating an embodiment of the layout of the portion of the scan driving circuit according to the disclosure.
Figure 9B:
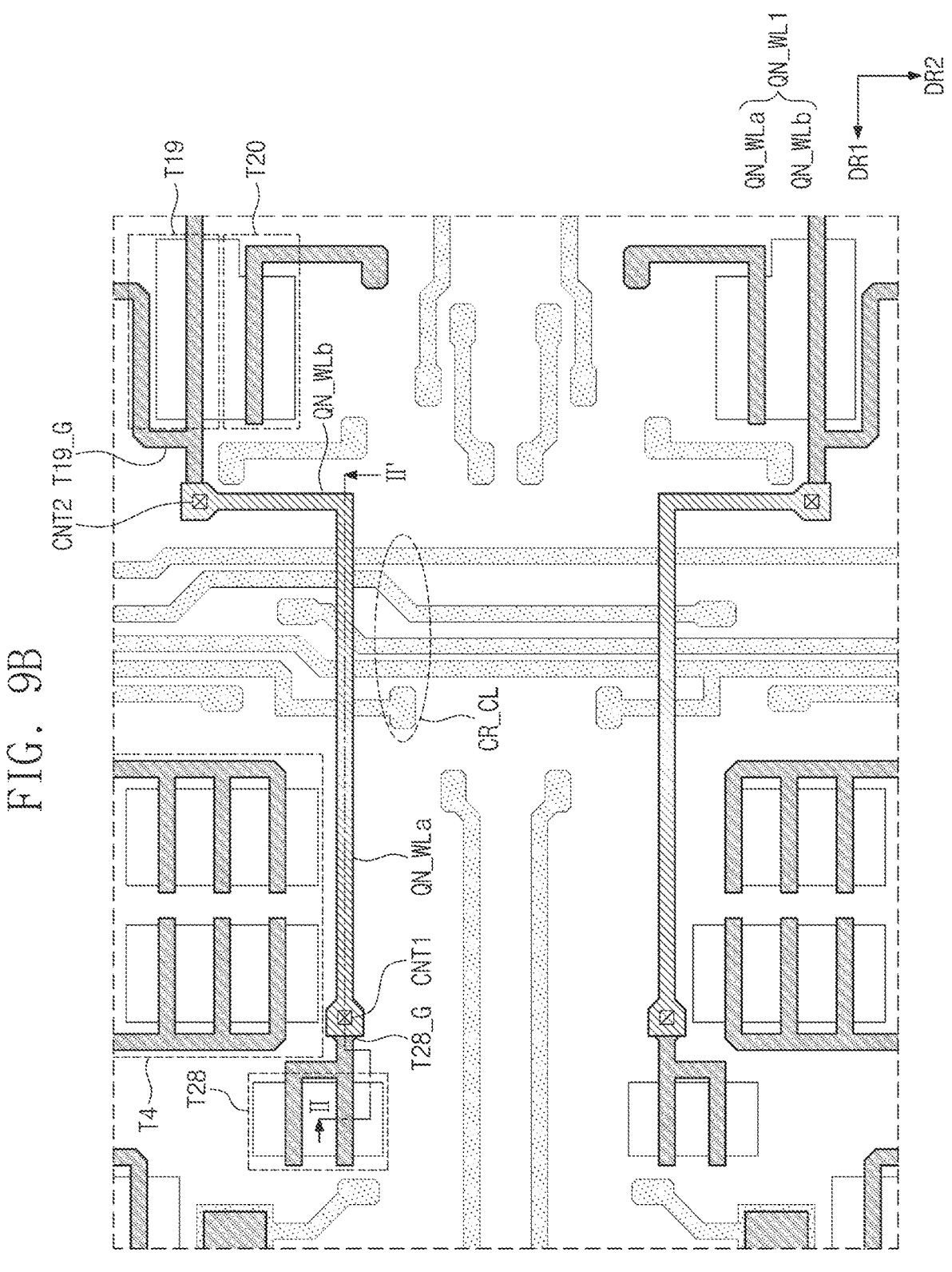
Figure 9C:
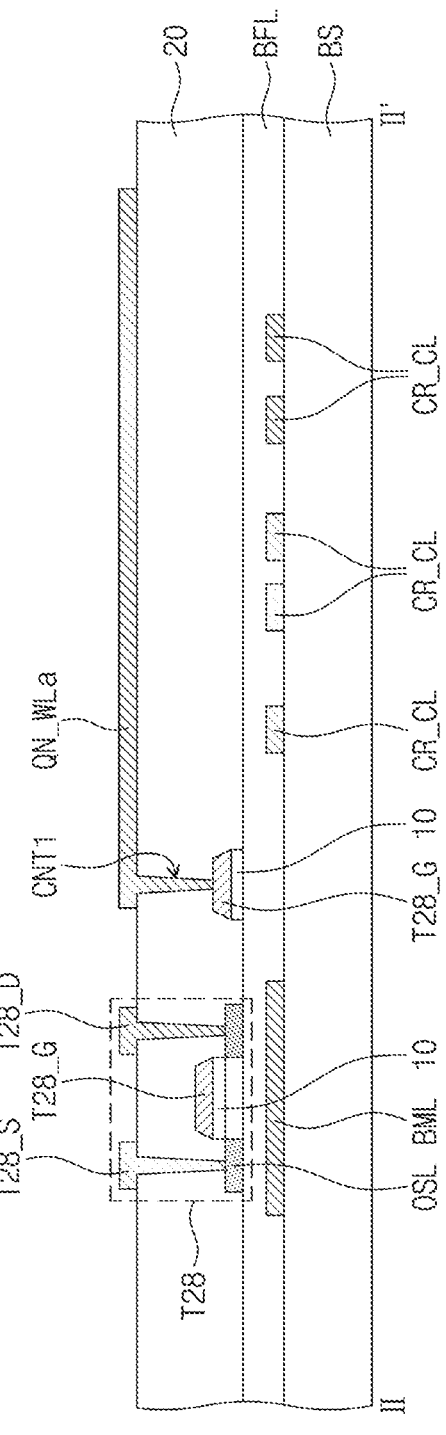
FIG. 9C is a cross-sectional view corresponding to line II-II' illustrated in FIG. 9B.

FIGS. 9A and 9B are plan views illustrating an embodiment of the layout of the portion of the scan driving circuit according to the disclosure. FIG. 9C is a cross-sectional view corresponding to line II-II' illustrated in FIG. 9B. However, the same components as those illustrated in the FIGS. 8A to 8C among the components illustrated in FIGS. 9A to 9C are designated by the same reference numerals, and a detailed description thereof will be omitted.

Referring to FIGS. 9A to 9C, a first control wiring QN_WL1 is disposed on the first insulation layer 20. The first control wiring QN_WL1 includes a first wiring portion QN_WLa extending in the first direction DR1 and a second wiring portion QN_WLb extending in the second direction DR2. In an embodiment of the disclosure, the first wiring portion QN_WLa is a part that intersects the carry wirings CR_CL such that the first wiring portion QN_WLa and the carry wirings CR_CL are insulated from each other, and the second wiring portion QN_WLb is a portion that does not intersect the carry wirings CR_CL. The first wiring portion QN_WLa and the second wiring portion QN_WLb may be arranged on the first insulation layer 20 and may have shapes integral with each other.

The first wiring portion QN_WLa is connected to the gate T28_G of the control transistor T28 through the first contact hole CNT1 passing through the first insulation layer 20. The second wiring portion QN_WLb may be connected to the gate T19_G of the control transistor T19 through the second contact hole CNT2 passing through the first insulation layer 20.

The first wiring portion QN_WLa overlaps the carry wirings CR_CL in a plan view, but two or more insulation layers (that is, the buffer insulation layer BFL and the first insulation layer 20) are arranged between the first wiring portion QN_WLa and the carry wirings CR_CL in a cross section. In an embodiment of the disclosure, the buffer insulation layer BFL may have a thickness of about 2500 Å or more, and the first insulation layer 20 may have a thickness of about 4500 Å or more. That is, a separation distance of about 7000 Å or more between the first wiring portion QN_WLa and the carry wirings CR_CL may be secured due to the buffer insulation layer BFL and the first insulation layer 20.

Figure 10A:
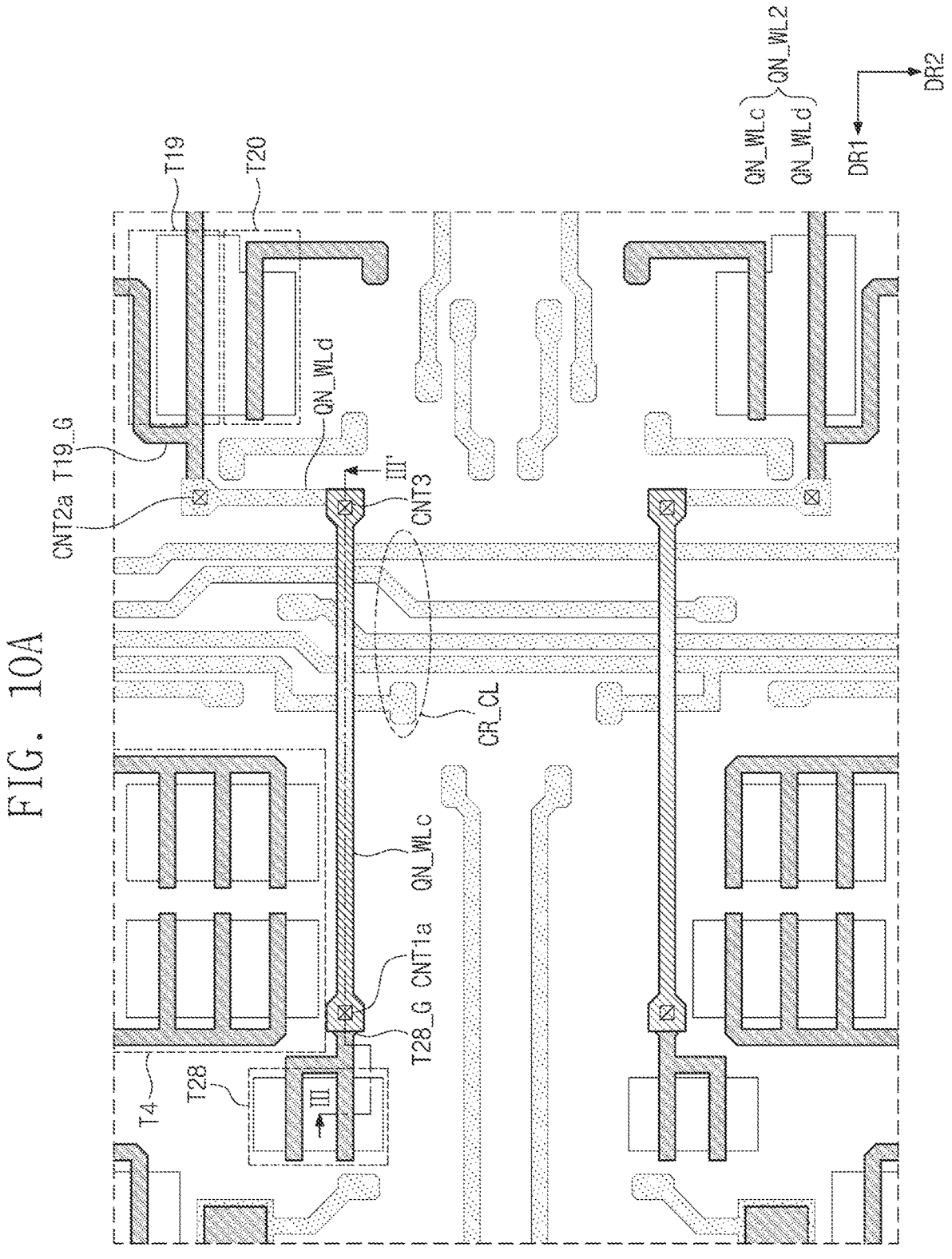
FIG. 10A is a plan view illustrating an embodiment of the layout of the portion of the scan driving circuit according to the disclosure.
Figure 10B:
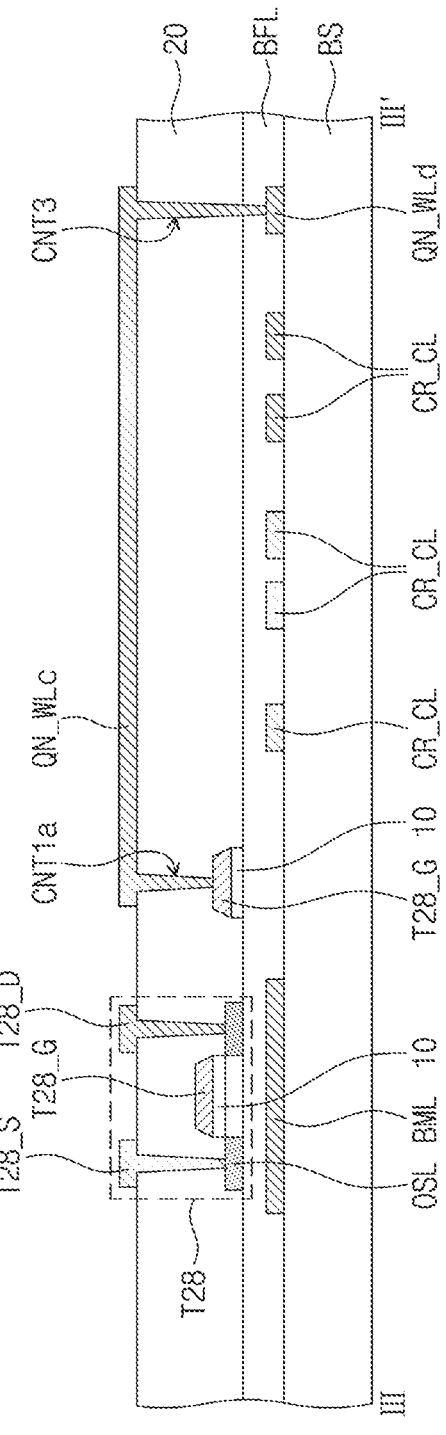
FIG. 10B is a cross-sectional view corresponding to line III-III' illustrated in FIG. 10A.

FIG. 10A is a plan view illustrating an embodiment of the layout of the portion of the scan driving circuit according to the disclosure, and FIG. 10B is a cross-sectional view corresponding to line III-III' illustrated in FIG. 10A. However, the same components as those illustrated in the FIGS. 9A to 9C among the components illustrated in FIGS. 10A and 10B are designated by the same reference numerals, and a detailed description thereof will be omitted.

Referring to FIGS. 10A and 10B, a first control wiring QN_WL2 is disposed on the first insulation layer 20. The first control wiring QN_WL2 includes a first wiring portion QN_WLc extending in the first direction DR1 and a second wiring portion QN_WLd extending in the second direction DR2. In an embodiment of the disclosure, the first wiring portion QN_WLc is a part that intersects the carry wirings CR_CL such that the first wiring portion QN_WLc and the carry wirings CR_CL are insulated from each other, and the second wiring portion QN_WLd is a part that does not intersect the carry wirings CR_CL. The first wiring portion QN_WLc is disposed on the first insulation layer 20, and the second wiring portion QN_WLd is disposed on a base layer BS. In detail, the first wiring portion QN_WLc is disposed on the same layer as those of the source T28_S and the drain T28_D of the control transistor T28, and the second wiring portion QN_WLd is disposed on the same layer as those of the carry wirings CR_CL and the shielding electrode BML. The first wiring portion QN_WLc and the second wiring portion QN_WLd may be arranged on different layers and may not have shapes integral with each other.

The first wiring portion QN_WLc is connected to the gate T28_G of the control transistor T28 through a first contact hole CNT1a passing through the first insulation layer 20. The first wiring portion QN_WLc is connected to the second wiring portion QN_WLd through a third contact hole CNT3 passing through the first insulation layer 20. Further, the second wiring portion QN_WLd may be connected to the gate T19_G of the control transistor T19 through a second contact hole CNT2a passing through the first insulation layer 20.

The first wiring portion QN_WLc overlaps the carry wirings CR_CL in a plan view, but two or more insulation layers (that is, the buffer insulation layer BFL and the first insulation layer 20) are arranged between the first wiring portion QN_WLc and the carry wirings CR_CL in a cross section. In an embodiment of the disclosure, the buffer insulation layer BFL may have a thickness of about 2500 Å or more, and the first insulation layer 20 may have a thickness of about 4500 Å or more. That is, a separation distance of about 7000 Å or more between the first wiring portion QN_WLc and the carry wirings CR_CL may be secured due to the buffer insulation layer BFL and the first insulation layer 20.

Figure 11:
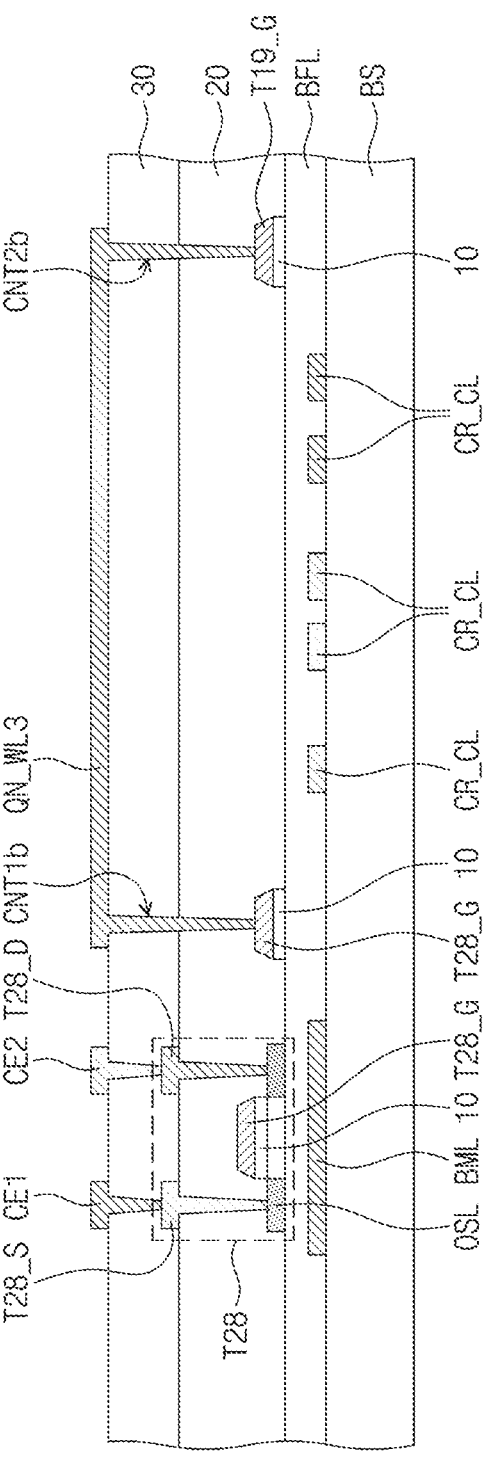
FIGS. 11 and 12 are cross-sectional views illustrating an embodiment of a portion of the scan driving circuit according to the disclosure.
Figure 12:
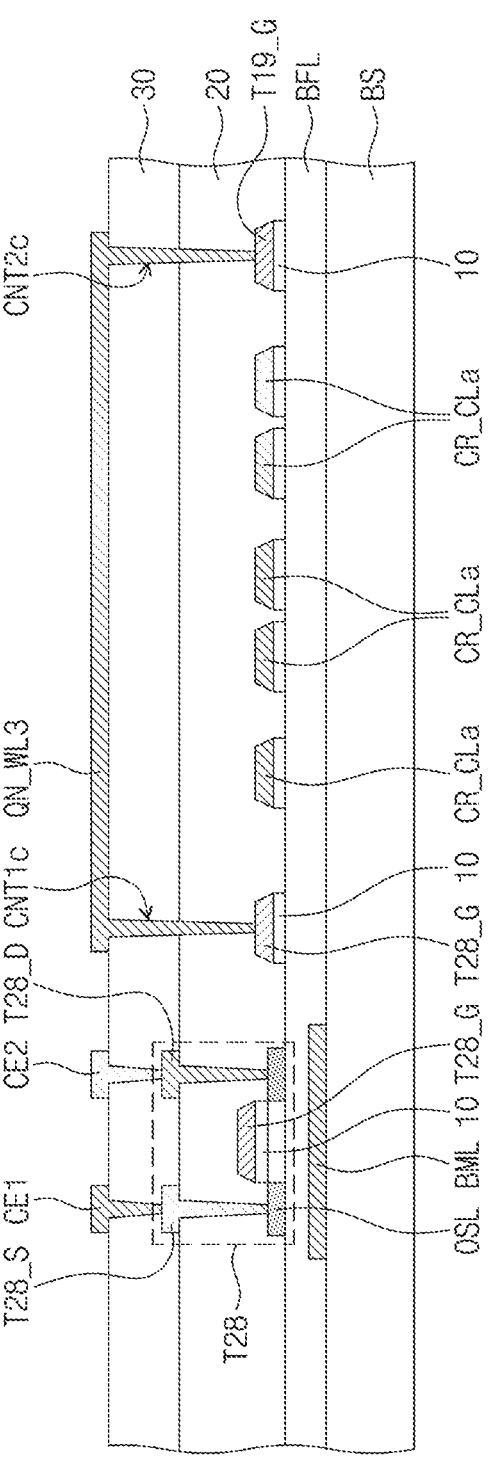

FIGS. 11 and 12 are cross-sectional views illustrating an embodiment of a portion of the scan driving circuit according to the disclosure. However, the same components as those illustrated in the FIG. 8C among the components illustrated in FIGS. 11 and 12 are designated by the same reference numerals, and a detailed description thereof will be omitted.

Referring to FIG. 11, a second insulation layer 30 that covers the source T28_S of the control transistor T28 and the drain T28_D of the control transistor T28 is disposed on the first insulation layer 20.

First and second connection electrodes CE1 and CE2 are arranged on the second insulation layer 30. The first and second connection electrodes CE1 and CE2 are formed from a conductive layer, and the source T28_S of the control transistor T28 and the drain T28_D of the control transistor T28 may be arranged through a contact hole passing through a third insulation layer. The first and second connection electrodes CE1 and CE2 may be connected to the source T28_S of the control transistor T28 and the drain T28_D of the control transistor T28, respectively.

Further, a first control wiring QN_WL3 is disposed on the second insulation layer 30. The first control wiring QN_WL3 may be connected to the gate T28_G of the control transistor T28 and the gate T19_G of the control transistor T19 through first and second contact holes CNT1b and CNT2b passing through the second insulation layer 30. The first control wiring QN_WL3 overlaps the carry wirings CR_CL in a plan view, but three or more insulation layers (that is, the buffer insulation layer BFL, the first insulation layer 20, and the second insulation layer 30) are arranged between the first control wiring QN_WL3 and the carry wirings CR_CL in a cross section. In an embodiment of the disclosure, the buffer insulation layer BFL may have a thickness of about 2500 Å or more, the first insulation layer 20 may have a thickness of about 4500 Å or more, and the second insulation layer 30 may have a thickness of about 10000 Å or more. That is, a separation distance of about 17000 Å or more between the first control wiring QN_WL3 and the carry wirings CR_CL may be secured due to the buffer insulation layer BFL, the first insulation layer 20, and the second insulation layer 30.

As three or more insulation layers (that is, the buffer insulation layer BFL, the first insulation layer 20, and the second insulation layer 30) are arranged between the first control wiring QN_WL3 and the carry wirings CR_CL, the separation distance of about 17000 Å or more between the first control wiring QN_WL3 and the carry wirings CR_CL may be sufficiently secured. As a result, a phenomenon in which the insulation layers between the first control wiring QN_WL3 and the carry wirings CR_CL are destroyed due to an electric field generated during a process of manufacturing the display panel DP (refer to FIG. 3) and thus the two wirings short-circuiting each other may be more effectively prevented.

FIGS. 8C, 9C, 10B, and 11 illustrate that the carry wirings CR_CL is disposed on the same layer (that is, the base layer BS) as the shielding electrode BML, but the disclosure is not limited thereto.

As illustrated in FIG. 12, carry wirings CR_CLa are disposed on the gate insulation layer 10 and thus may be disposed on the same layer as the gate T28_G of the control transistor T28 and the gate T19_G of the control transistor T19. In this case, the first control wiring QN_WL3 may be disposed on the second insulation layer 30. Thus, two or more insulation layers (that is, the first insulation layer 20 and the second insulation layer 30) are arranged between the first control wiring QN_WL3 and the carry wirings CR_CLa. In an embodiment of the disclosure, the first insulation layer 20 may have a thickness of about 4500 Å or more, and the second insulation layer 30 may have a thickness of about 10000 Å or more. That is, a separation distance of about 14500 Å or more between the first control wiring QN_WL3 and the carry wirings CR_CLa may be secured due to the first insulation layer 20 and the second insulation layer 30. In an embodiment, the first control wiring QN_WL3 may be connected to the gate T28_G of the control transistor T28 and the gate T19_G of the control transistor T19 through first and second contact holes CNT1c and CNT2c passing through the second insulation layer 30.

As described above, as two or more insulation layers (that is, a buffer insulation layer and a first insulation layer) are arranged between a control wiring and carry wirings, a separation distance between the control wiring and the carry wirings may be sufficiently secured. As a result, a phenomenon in which the insulation layers between the control wiring and the carry wirings are destroyed due to an electric field generated in a process of manufacturing a display panel and thus the two wirings short-circuiting each other may be prevented. Accordingly, the reliability of the scan driving circuit may be improved.

Although the description has been made above with reference to an embodiment of the disclosure, it may be understood that those skilled in the art or those having ordinary knowledge in the art may variously modify and changes the disclosure without departing from the spirit and technical scope of the disclosure described in the appended claims. Accordingly, the technical scope of the disclosure is not limited to the detailed description of the specification but should be defined by the appended claims.

What is claimed is:

1. A display device comprising:
   a base layer;
   a pixel disposed on the base layer;
   a scan driving circuit disposed on the base layer and connected to the pixel, the scan driving circuit including:
   a plurality of stages including:
   a $j^{th}$ stage among the plurality of stages is connected to at least one adjacent stage through carry wirings, j being a natural number greater than or equal to one, and the $j^{th}$ stage including:
   a plurality of control transistors respectively including gates connected to a control node; and
   a control wiring which connects the control node and the gates of the plurality of control transistors and physically intersects the carry wirings in a plan view; and two or more insulation layers arranged between the control wiring and the carry wirings in the scan driving circuit, wherein the $j^{th}$ stage further comprises a scan output unit outputting a scan signal through an output terminal and including a buffer transistor connected to the output terminal and different from the plurality of control transistors not directly connected to the output terminal, a gate of the buffer transistor is electrically connected to the control node through the control wiring, and the control wiring is disposed on a layer different from a layer on which the gates of the plurality of control transistors are disposed.

2. The display device of claim 1, wherein the carry wirings are disposed on the base layer, the two or more insulation layers include:

a buffer insulation layer which is disposed on the base layer and covers the carry wirings; and a first insulation layer which is disposed on the buffer insulation layer and covers the gates of the plurality of control transistors, and wherein the control wiring is disposed on the first insulation layer.

3. The display device of claim 2, wherein the gates of the plurality of control transistors overlap a channel area of a semiconductor pattern, and each of the plurality of control transistors further includes:

the semiconductor pattern; and a source and a drain connected to a source area and a drain area of the semiconductor pattern, respectively.

4. The display device of claim 3, wherein the semiconductor pattern includes an oxide semiconductor.

5. The display device of claim 3, wherein the control wiring includes:

a first wiring portion intersecting the carry wirings such that the first wiring portion and the carry wirings are insulated from each other; and a second wiring portion that does not intersect the carry wirings.

6. The display device of claim 5, wherein the first wiring portion and the second wiring portion of the control wiring and the source and the drain are arranged on the first insulation layer.

7. The display device of claim 5, wherein the first wiring portion of the control wiring and the source and the drain are arranged on the first insulation layer, and the second wiring portion of the control wiring and the carry wirings are arranged on the base layer.

8. The display device of claim 5, wherein the $j^{th}$ stage further includes a shielding electrode overlapping the semiconductor pattern, and the carry wirings and the shielding electrode are arranged on the base layer.

9. The display device of claim 1, wherein the carry wirings are disposed on the base layer, the two or more insulation layers include:

a buffer insulation layer which is disposed on the base layer and covers the carry wirings;

a first insulation layer which is disposed on the buffer insulation layer and covers the gates of the plurality of control transistors; and a second insulation layer disposed on the first insulation layer, and wherein the control wiring is disposed on the second insulation layer.

10. The display device of claim 9, wherein the gates of the plurality of control transistors overlap a channel area of a semiconductor pattern, and each of the plurality of control transistors further includes:

the semiconductor pattern; and a source and a drain connected to a source area and a drain area of the semiconductor pattern, and a connection electrode is connected to one of the source and the drain.

11. The display device of claim 10, wherein the control wiring includes:

a first wiring portion intersecting the carry wirings such that the first wiring portion and the carry wirings are insulated from each other; and a second wiring portion that does not intersect the carry wirings.

12. The display device of claim 11, wherein the first wiring portion and the second wiring portion of the control wiring and the connection electrode are arranged on the second insulation layer.

13. The display device of claim 11, wherein the first wiring portion of the control wiring and the connection electrode are arranged on the second insulation layer, and the second wiring portion of the control wiring and the carry wirings are arranged on the base layer.

14. The display device of claim 1, further comprising:

a shielding electrode disposed on the base layer.

15. The display device of claim 14, wherein the two or more insulation layers include:

a buffer insulation layer which is disposed on the base layer and covers the shielding electrode;

a first insulation layer which is disposed on the buffer insulation layer and covers the gates of the plurality of control transistors; and a second insulation layer disposed on the first insulation layer, wherein the carry wirings are disposed on the buffer insulation layer, and the control wiring is disposed on the second insulation layer.

16. The display device of claim 1, wherein each of a plurality of pixel transistors includes an oxide semiconductor, and each of the plurality of pixel transistors and the plurality of control transistors is a same-type transistor.

17. An electronic device comprising:

a base layer;

a plurality of pixels arranged on the base layer; and a scan driving circuit disposed on the base layer and connected to the plurality of pixels, the scan driving circuit including:

a plurality of stages including:

a $j^{th}$ stage connected to at least one adjacent stage through carry wirings, j being a natural number greater than or equal to one, and the $j^{th}$ stage including:

a plurality of control transistors respectively including gates connected to a control node; and a control wiring which connects the control node and the gates of the plurality of control transistors, the control wiring including:

a first wiring portion physically intersecting the carry wirings in a plan view such that the first wiring portion and the carry wirings are insulated from each other; and a second wiring portion that extends from the first wiring portion does not physically intersect the carry wirings in the plan view; and two or more insulation layers arranged between the control wiring and the carry wirings in the scan driving circuit, wherein the first wiring portion and the second wiring portion are arranged on different layers, wherein the j$^{th}$ stage further comprises a scan output unit outputting a scan signal through an output terminal and including a buffer transistor connected to the output terminal and different from the plurality of control transistors not directly connected to the output terminal, a gate of the buffer transistor is electrically connected to the control node through the control wiring, and the control wiring is disposed on a layer different from a layer on which the gates of the plurality of control transistors are disposed.

18. The electronic device of claim 17, wherein the two or more insulation layers comprise:

a buffer insulation layer disposed on the base layer; and a first insulation layer which is disposed on the buffer insulation layer and covers the gates of the plurality of control transistors, wherein the carry wirings are disposed on the base layer and covered by the buffer insulation layer, and the first wiring portion is disposed on the first insulation layer.

19. The electronic device of claim 18, wherein the gates of the plurality of control transistors overlap a channel area of a semiconductor pattern, and each of the plurality of control transistors further includes:

the semiconductor pattern; and a source and a drain connected to a source area and a drain area of the semiconductor pattern.

20. The electronic device of claim 19, wherein the first wiring portion and the source and the drain are arranged on the first insulation layer, and the second wiring portion and the carry wirings are arranged on the base layer.

21. The electronic device of claim 17, wherein the two or more insulation layers comprise:

a buffer insulation layer disposed on the base layer;

a first insulation layer which is disposed on the buffer insulation layer and covers the gates of the plurality of control transistors; and a second insulation layer disposed on the first insulation layer, wherein the carry wirings are disposed on the base layer and are covered by the buffer insulation layer, and the first wiring portion is disposed on the second insulation layer.

22. The electronic device of claim 21, wherein the gates of the plurality of control transistors overlap a channel area of a semiconductor pattern, and each of the plurality of control transistors includes:

the semiconductor pattern; and a source and a drain connected to a source area and a drain area of the semiconductor pattern, and a connection electrode is connected to one of the source and the drain.

23. The electronic device of claim 22, wherein the first wiring portion and the connection electrode are arranged on the second insulation layer, and the second wiring portion and the carry wirings are arranged on the base layer.

24. The electronic device of claim 17, further comprising:

a shielding electrode disposed on the base layer.

25. The electronic device of claim 24, wherein the two or more insulation layers comprise:

a buffer insulation layer which is disposed on the base layer and covers the shielding electrode;

a first insulation layer which is disposed on the buffer insulation layer and covers the gates of the plurality of control transistors; and a second insulation layer disposed on the first insulation layer, wherein the carry wirings are disposed on the buffer insulation layer, and the first wiring portion is disposed on the second insulation layer.

26. The electronic device of claim 25, wherein the second wiring portion and the shielding electrode are arranged on the base layer.

* * * * *